(12) United States Patent
Jeong et al.

(10) Patent No.: US 11,574,973 B2
(45) Date of Patent: Feb. 7, 2023

(54) METHOD OF MANUFACTURING DISPLAY PANEL AND DISPLAY APPARATUS INCLUDING THE DISPLAY PANEL

(71) Applicant: SAMSUNG DISPLAY CO., LTD., Yongin-si (KR)

(72) Inventors: Yu-Gwang Jeong, Anyang-si (KR); Taewook Kang, Seongnam-si (KR); Wooyong Sung, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/094,247

(22) Filed: Nov. 10, 2020

(65) Prior Publication Data
US 2021/0134913 A1    May 6, 2021

Related U.S. Application Data

(62) Division of application No. 16/293,908, filed on Mar. 6, 2019, now Pat. No. 10,903,293.

(30) Foreign Application Priority Data

Mar. 13, 2018  (KR) ........................ 10-2018-0028923

(51) Int. Cl.
| | | |
|---|---|---|
| H01L 51/00 | (2006.01) | |
| H01L 27/32 | (2006.01) | |
| H01L 51/56 | (2006.01) | |
| H01L 51/52 | (2006.01) | |
| H01L 51/50 | (2006.01) | |

(52) U.S. Cl.
CPC ........ *H01L 27/3258* (2013.01); *H01L 27/323* (2013.01); *H01L 51/0096* (2013.01); *H01L 51/5012* (2013.01); *H01L 51/5256* (2013.01); *H01L 51/56* (2013.01); *H01L 2227/323* (2013.01)

(58) Field of Classification Search
CPC ............... H01L 27/3258; H01L 27/323; H01L 51/0096; H01L 51/5012; H01L 51/5256
See application file for complete search history.

(56) References Cited

U.S. PATENT DOCUMENTS

| | | |
|---|---|---|
| 8,446,541 B2 | 5/2013 | Kim et al. |
| 10,135,010 B2 | 11/2018 | Kim et al. |
| 10,930,885 B2 | 2/2021 | Kim et al. |

(Continued)

FOREIGN PATENT DOCUMENTS

| | | |
|---|---|---|
| KR | 101646783 | 8/2016 |
| KR | 1020170019553 | 2/2017 |

(Continued)

*Primary Examiner* — Shih Tsun A Chou
(74) *Attorney, Agent, or Firm* — F. Chau & Associates, LLC

(57) ABSTRACT

A method of manufacturing a display panel includes providing an insulating substrate that includes a hole area, a display area that surrounds the hole area, and a peripheral area adjacent to the display area, forming a semiconductor pattern in the display area, forming an insulating layer, forming contact holes in the insulating layer that expose portions of the semiconductor pattern, and forming a module hole by etching a portion of the insulating layer and a portion of the insulating substrate that overlap the hole area.

8 Claims, 24 Drawing Sheets

(56) References Cited

U.S. PATENT DOCUMENTS

| | | |
|---|---|---|
| 2008/0246027 A1 | 10/2008 | Kim |
| 2014/0346519 A1 | 11/2014 | Ke et al. |
| 2015/0060402 A1 | 3/2015 | Burkett et al. |
| 2016/0190389 A1 | 6/2016 | Lee et al. |
| 2017/0031323 A1* | 2/2017 | Kim .................... H01L 27/3246 |
| 2017/0047544 A1* | 2/2017 | Kang ...................... H01L 51/56 |
| 2017/0150618 A1 | 5/2017 | Choi et al. |
| 2017/0237038 A1 | 8/2017 | Kim et al. |
| 2019/0288047 A1 | 9/2019 | Jeong et al. |
| 2019/0312225 A1 | 10/2019 | Wang et al. |

FOREIGN PATENT DOCUMENTS

| | | |
|---|---|---|
| KR | 1020170045459 | 4/2017 |
| KR | 1020170059527 | 5/2017 |
| KR | 1020170096646 | 8/2017 |
| KR | 1020190018120 | 2/2019 |

\* cited by examiner

METHOD OF MANUFACTURING DISPLAY PANEL AND DISPLAY APPARATUS INCLUDING THE DISPLAY PANEL

CROSS-REFERENCE TO RELATED APPLICATION

This U.S. non-provisional patent application is a divisional of U.S. application Ser. No. 16/293,908, filed on Mar. 6, 2019 in the U.S. Patent and Trademark Office, which claims priority under 35 U.S.C. § 119 from, and the benefit of, Korean Patent Application No. 10-2018-0028923, filed on Mar. 13, 2018 in the Korean Intellectual Property Office, the contents of both of which are herein incorporated by reference in their entireties.

BACKGROUND

Embodiments of the present disclosure are directed to a method of manufacturing a display panel and a display apparatus that includes the display panel, and more particularly, to a method of manufacturing, a display panel with improved reliability and a display apparatus that includes the display panel.

A display panel is activated by an electrical signal to display an image. Of display panels, an organic light emitting display panel has low power consumption, high brightness and high response speed characteristics.

An organic light emitting display panel includes an organic light emitting device. However, an organic light emitting device can easily be damaged by moisture or oxygen. Thus, external moisture or oxygen should be blocked to improve the life span and reliability of an organic light emitting display panel.

SUMMARY

Embodiments of the present disclosure can provide a display apparatus that includes a display panel that can prevent interference with an electronic module, and a method of manufacturing a display panel with simplified processes.

In an embodiment of the inventive concepts, a method of manufacturing a display panel includes providing an insulating substrate that includes a hole area, a display area that surrounds the hole area, and a peripheral area adjacent to the display area, forming a semiconductor pattern be display area, forming an insulating layer that overlaps the hole area and the display area on the semiconductor pattern, forming contact holes in the insulating layer that expose portions of the semiconductor pattern, forming electrodes in the contact holes that connect to the semiconductor pattern through the contact holes, and forming a module hole by etching a portion of the insulating layer and a portion of the insulating substrate that overlap the hole area.

In an embodiment, forming the module hole may include forming a first hole by removing the portion of the insulating layer that overlaps the hole area, forming a second hole by removing a portion of the insulating substrate that overlaps the first hole, and forming an undercut in the second hole, wherein the first hole may be simultaneously formed with the contact holes.

In an embodiment, forming the electrodes may include forming a conductive layer that fills the contact holes and the first hole, forming photoresist patterns on the conductive layer, etching the conductive layer to form the electrodes, and removing the photoresist patterns. Forming the second hole may be performed simultaneously with etching the conductive layer, and forming the undercut and removing the photoresist patterns may be performed at the same time In an embodiment, the photoresist patterns may be removed by oxygen plasma.

In an embodiment, the method may further include forming a blocking recess in the hole area, wherein the blocking recess is spaced apart from the module hole and surrounds at least a portion of the module hole, wherein a depth of the blocking recess may be less than a thickness of the insulating substrate In an embodiment, the method may further include forming an organic layer after the forming of the electrodes. An end of the organic layer may be defining boundary of the module hole.

In an embodiment, the organic layer may be formed by at evaporation process.

In an embodiment, the method may further include forming an inorganic film in the display area after forming the organic layer. The inorganic film may extend from the display area into the hole area to cover an inner surface of the module hole.

In an embodiment, the inorganic film may be formed by a deposition process.

In an embodiment of the inventive concepts, a display apparatus includes a display panel that includes a front surface that includes a hole area, a display area that surrounds the hole area, and a peripheral area adjacent to the display area, and a rear surface opposite to the front surface, and an electronic module that overlaps the display panel. The display panel includes an insulating substrate that includes a base layer and a barrier layer, an organic light emitting device disposed on the insulating substrate of the display area and that includes an emission layer and an organic layer, an encapsulation member that covers the organic light emitting device and includes an inorganic film and an organic film, and a module hole spaced apart from the peripheral area and formed in the display area that penetrates the insulating substrate and the organic layer. The electronic module overlaps the module hole. The base layer and the barrier layer may include ends at the module hole, and the end of the base layer and the end of the barrier layer may be parallel to a thickness direction of the insulating substrate when viewed in a cross-sectional view.

In an embodiment, the end of the base layer and the end of the barrier layer may be covered by the inorganic film.

In an embodiment, the end of the base layer and the end of the barrier layer may not be aligned with each other in the thickness direction.

In an embodiment, an end of the organic layer may be aligned with the end of the barrier layer, and the inorganic film may cover the end of the organic layer.

In an embodiment, the electronic module receives an external input provided to the front surface of the display panel through the module hole.

In an embodiment, the electronic module may be received in the module hole.

In an embodiment, the display panel may further include a blocking, recess formed in the hole area. The blocking recess may be spaced apart from the module hole and may surround the module hole, and a depth of the blocking recess may be less than a depth of the module hole.

In an embodiment, the blocking recess may include a hole portion that penetrates the barrier layer, and a recessed portion formed in the base layer.

In are embodiment, the base layer includes an organic material and the barrier layer includes an inorganic material.

In an embodiment of the inventive concepts, a method of manufacturing a display panel includes providing an insulating substrate that includes a hole area, a display area surrounding then hole area, and a peripheral area adjacent to the display area; forming a semiconductor pattern in the display area; forming an insulating layer that overlaps with the hole area and the display area on the semiconductor pattern; and forming a module hole by etching a portion of the insulating layer and a portion of the insulating substrate that overlap the hole area. Forming the module hole includes forming a first hole by removing the portion of the insulating layer that overlaps the hole area; forming a second hole by removing a portion of the insulating substrate that overlaps with the first hole; and forming an undercut in the second hole.

The method may further include forming contact holes in the insulating layer that expose portions of the semiconductor pattern; and forming electrodes in the contact holes that connect to the semiconductor pattern through the contact holes. Forming the electrodes may include forming a conductive layer that fills the contact holes and the first hole; forming photoresist patterns on the conductive layer; etching the conductive layer to form the electrodes; and removing the photoresist patterns. The first hole may be simultaneously formed with the contact holes, the second hole may be formed simultaneously with etching the conductive layer, and forming the undercut and removing the photoresist patterns may be performed at the same time.

DETAILED DESCRIPTION OF EXEMPLARY EMBODIMENTS

Figure 1:
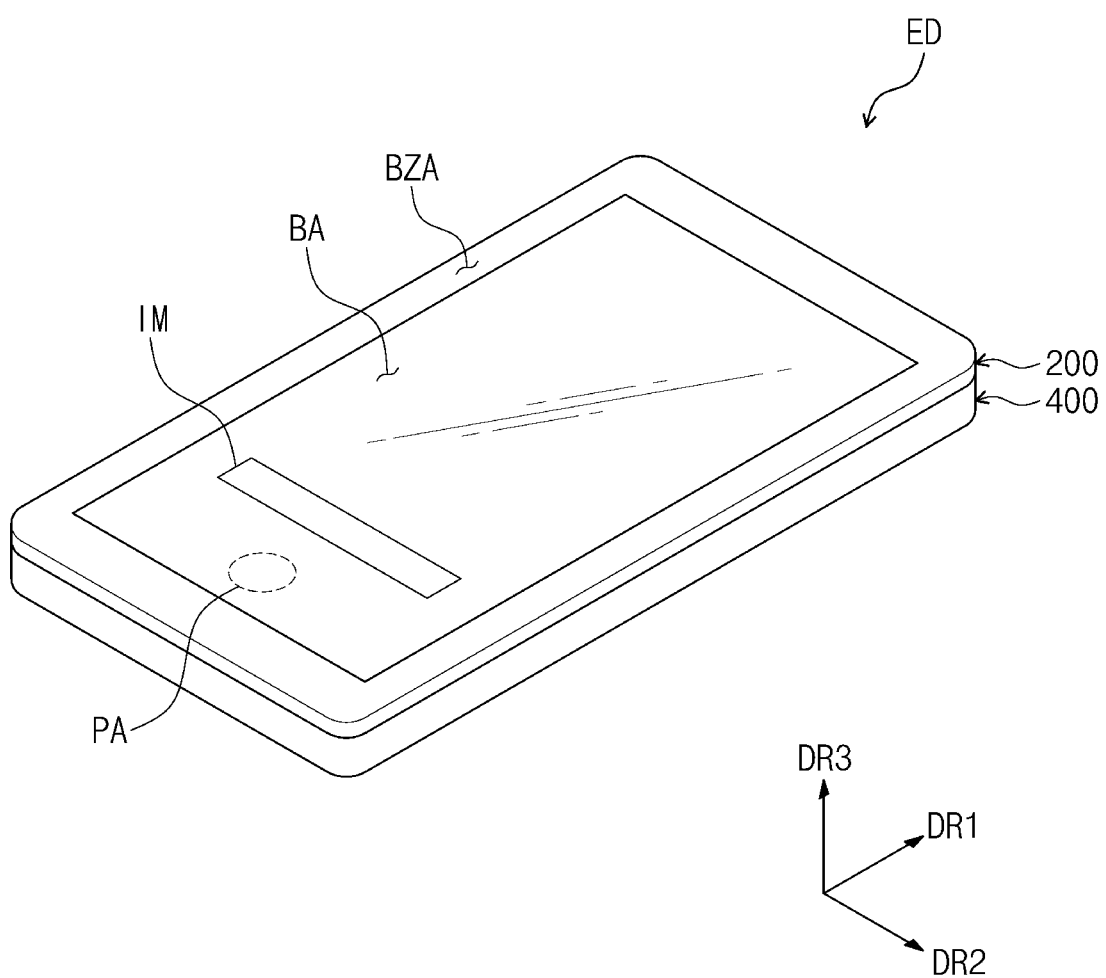
FIG. 1 is a perspective view of a display apparatus according to an embodiment of the inventive concepts.

Embodiments of the inventive concepts now will be described more fully hereinafter with reference to the accompanying drawings, in which various embodiments are shown. The inventive concepts may, however, be embodied in many different forms, and should not be construed as limited to exemplary embodiments set forth herein. Like reference numerals may refer to like elements throughout. It will be understood that when an element such as a layer, region or substrate is referred to as being "on" another element, it can be directly on the other element or intervening elements may be present.

Figure 2:
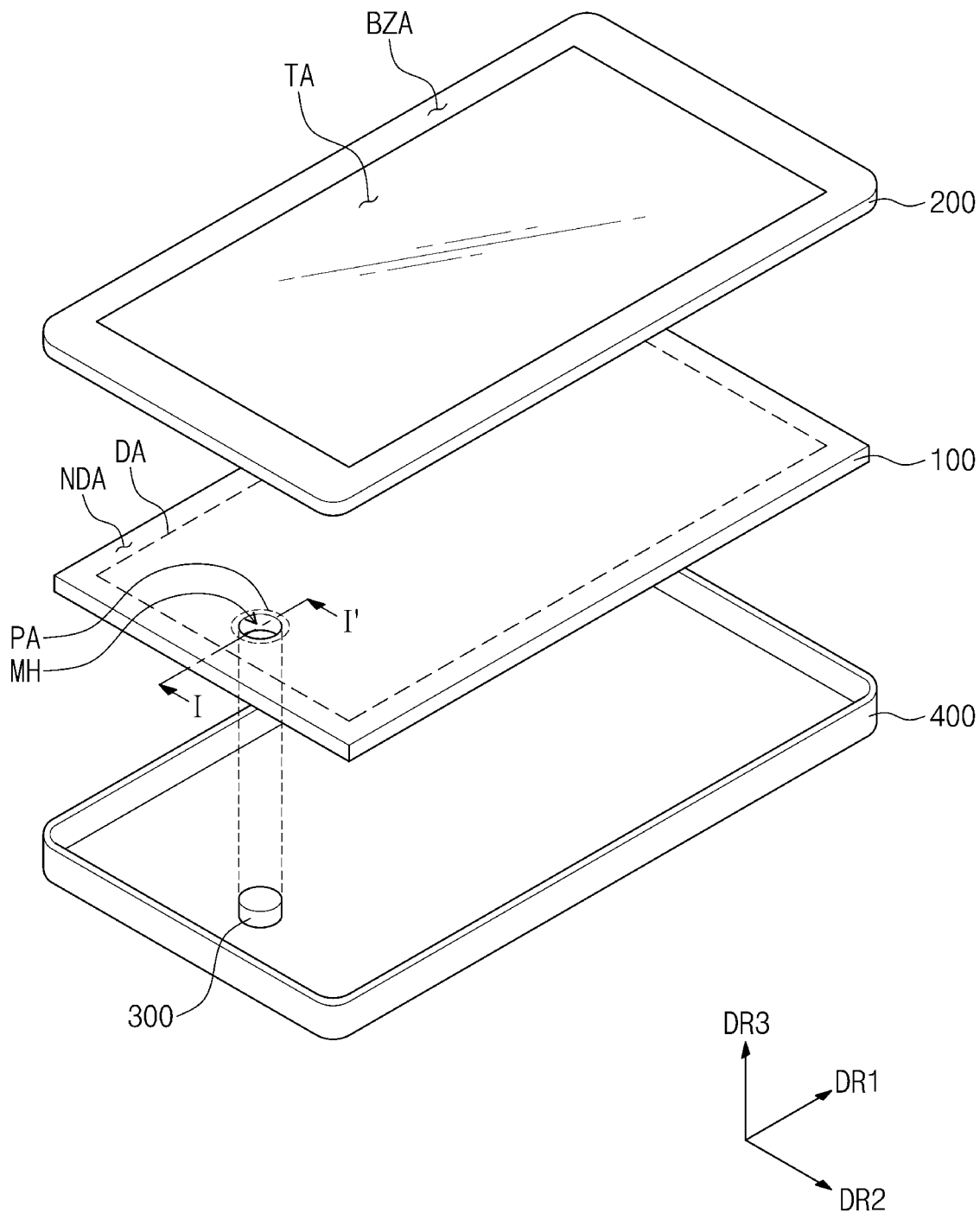
FIG. 2 is an exploded perspective view of a display apparatus of FIG. 1.
Figure 3:
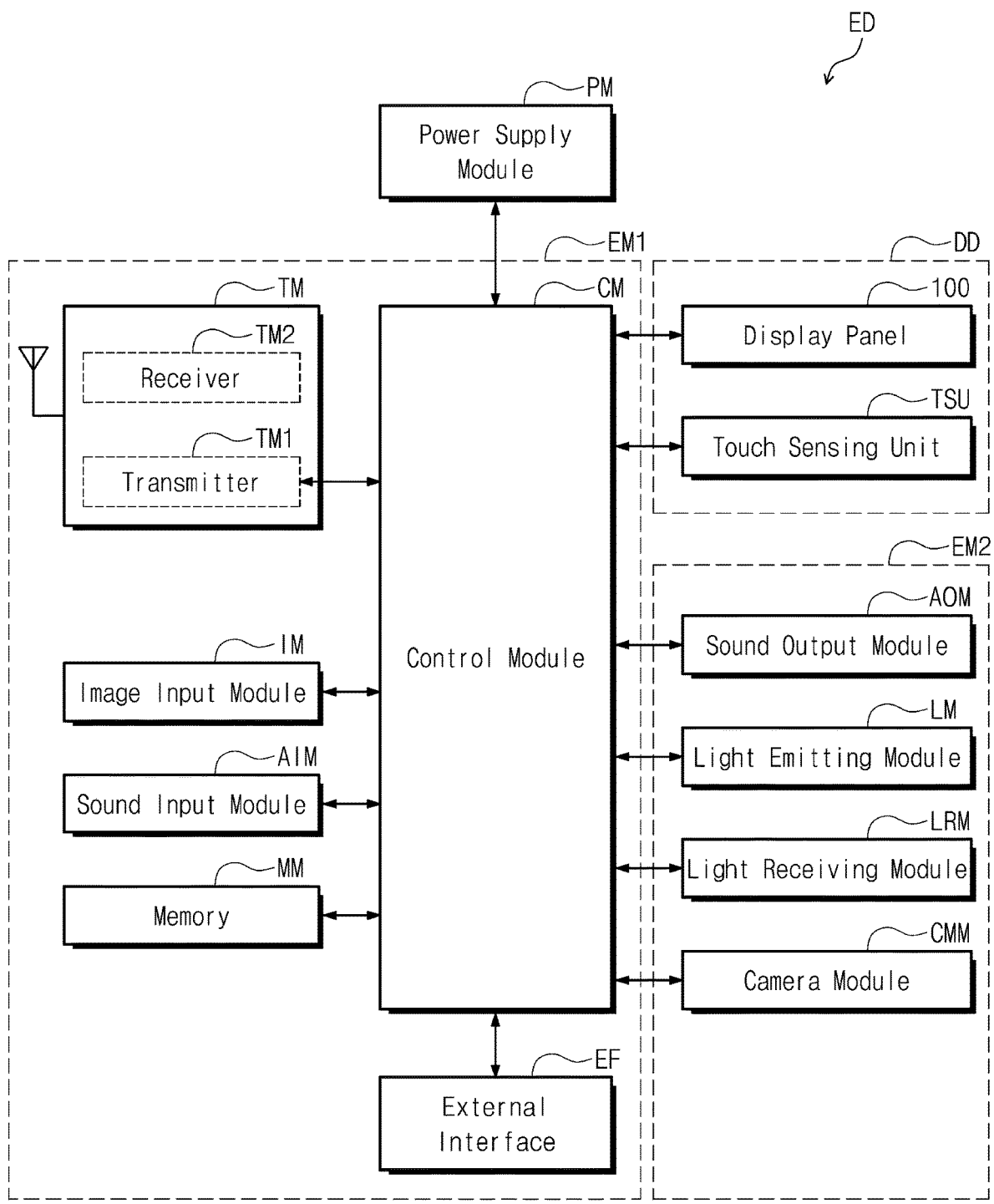
FIG. 3 is a block diagram of a display apparatus of FIG. 1.

FIG. 1 is a perspective view of a display apparatus according to an embodiment of the inventive concepts. FIG. 2 is an exploded perspective view of a display apparatus of FIG. 1. FIG. 3 is a block diagram of a display apparatus of FIG. 1. Hereinafter, a display apparatus according to an embodiment of the inventive concepts will be described with reference to FIGS. 1 to 3.

A display apparatus ED is activated by an electrical signal. The display apparatus ED may be realized as various embodiments. For example, the display apparatus ED may be realized as a tablet, a notebook computer, a personal computer, a smart television, or a smart phone, lit a present embodiment, a smart phone is illustrated as an example of the display apparatus ED.

As illustrated in FIG. 1, according to an embodiment, the display apparatus ED provides a display surface at its front surface. An image IM can be displayed on the display surface. The display surface is parallel to a plane defined by a first direction DR1 and a second direction DR2. The display surface includes a display area BA and a bezel area BZA adjacent to the display area BA.

According to an embodiment, the display apparatus ED displays the image TM through the display area BA of the display surface. In FIG. 1, an internet search box is illustrated as an example of the image IM. The display area BA has a rectangular shape parallel to the first and second directions DR1 and DR2. However, embodiments of the inventive concepts are not limited thereto. The shape of the display area BA may be variously modified.

According to an embodiment, the bezel area BZA is adjacent to the display area BA. The bezel area BZA surrounds the display area BA when viewed in a plan view. However, embodiments of the inventive concepts are not limited thereto. In other embodiments, the bezel area BZA is adjacent to only one side of the display area BA or is omitted. The display apparatus ED includes various embodiments but is not be limited to a specific embodiment.

According to an embodiment, a normal direction of the display surface corresponds to a thickness direction, hereinafter referred to as a third direction DR3 of the display apparatus ED. In a present embodiment, a front or top surface and a rear or bottom surface of each display apparatus ED are defined by a direction, such as the third direction DR3, in which the image IM is displayed. The front surface and the rear surface are opposite to each other in the third direction DR3.

However, directions indicated by the first to third directions DR1, DR2 and DR3 may be changed into other directions.

As illustrated in FIGS. 1 to 3, according to an embodiment, the display apparatus ED includes a display panel 100, a window member 200, an electronic module 300, and a housing member 400. In more detail, as illustrated in FIG. 3, the display apparatus ED includes a display module DD, a first electronic module EM1, a second electronic module EM2, and a power supply module PM. Some of components illustrated in FIG. 3 are omitted in FIG. 2.

According to an embodiment, the display module DD includes the display panel 100 and a touch sensing unit TSU. The display panel 100 displays the image IM. In an embodiment, the display panel 100 can also sense an external user input. In this case, the display panel 100 further includes a touch sensor, and the touch sensing unit TSU can be omitted.

According to an embodiment, the touch sensing unit TSU senses an externally provided user input. The user's input includes at least one of various external inputs, such as a part of the user's body, such as a finger, light, heat, or pressure. The touch sensing unit TSU is omitted in FIG. 2.

On the other hand, in a present embodiment, the display panel 100 includes a hole area PA, a display area DA, and a peripheral area NDA. The image IM is displayed through the display area DA. The display area DA is externally visible through a transmission area TA of the window member 200. A plurality of pixels that generate the image IM are disposed in the display area DA. This will be described below in more detail.

According to an embodiment, the peripheral area NDA is adjacent to the display area DA. The peripheral area NDA surrounds the display area DA when viewed in a plan view. A driving circuit or driving lines that drive the display area DA are disposed in the peripheral area NDA.

In an embodiment, a portion of the peripheral area NDA of the display panel 100 is curved. Thus, a portion of the peripheral area NDA faces the front surface of the display apparatus ED, and another portion of the peripheral area NDA faces a rear surface of the display apparatus ED. Alternatively, the peripheral area NDA may be omitted in the display panel 100 according to an embodiment of the inventive concepts.

According to an embodiment, the hole area PA is surrounded by the display area DA when viewed in a plan view. The hole area PA is spaced apart from the peripheral area NDA with the display area DA interposed therebetween when viewed in a cross-sectional view. A module hole MH is disposed in the hole area PA. Thus, the module hole MH is formed in the display area DA in which the image IM is displayed.

According to an embodiment, the module hole MH penetrates the display panel 100. The module hole MH has a cylindrical shape and has a height in the third direction DR3. The module hole MN overlaps the electronic module 300 when viewed in a plan view. The electronic module 300 is inserted into the module hole MH to receive an external input or can receive an external input through the module hole MH.

According to an embodiment of the inventive concepts, since the display panel 100 includes the module hole MH, no separate space for the electronic module 300 is provided in the peripheral area NDA. Thus, an area or a size of the peripheral area NDA can be reduced to realize the display apparatus ED having a narrow bezel. In addition, when the electronic module 300 is received in the module hole MH, a thin display apparatus ED can be realized.

According to an embodiment, the window member 200 provides the front surface of the display apparatus ED. The window member 200 is disposed on a front surface of the display panel 100 to protect the display panel 100. For example, the window member 200 may include a glass substrate, a sapphire substrate, or a plastic film. The window member 200 may have a single-layered or multi-layered structure. For example, the window member 200 has a stack structure that includes a plurality of plastic films coupled to each other by an adhesive, or has a stack structure which includes a glass substrate and a plastic film coupled to each other by an adhesive.

According to an embodiment, the window member 200 includes the transmission area TA and the bezel area BZA. The transmission area TA corresponds to the display area DA of the display panel 100 and the display area BA of the display apparatus ED. For example, the transmission area TA overlaps all or at least part of the display area DA. The image IM displayed on the display area DA of the display panel 100 is visible through the transmission area TA.

According to an embodiment, the bezel area BZA defines a shape of the transmission area TA. The bezel area BZA is adjacent to the transmission area TA and surrounds the transmission area TA in a plan view. The bezel area BZA has a predetermined color. The bezel area BZA covers the peripheral area NDA of the display panel 100 to prevent the peripheral area NDA from being externally visible. However, embodiments of the inventive concepts are not limited thereto. In another embodiment or the inventive concepts, the bezel area BZA may be omitted from the window member 200.

According to an embodiment, the power supply module PM supplies power necessary for the overall operations of the display apparatus ED. The power supply module PM includes a battery module.

According to an embodiment, the housing member 400 is coupled to the window member 200. The housing member 400 provides the rear surface of the display apparatus ED. The housing member 400 may be coupled to the window member 200 to surround an inner space, and the display panel 100, the electronic module 300 and various components of FIG. 3 can be received in the inner space. The housing member 400 is formed of a rigid material. For example, the housing member 400 includes a plurality of frames or plates, which are formed of glass, plastic, or a metal. The housing member 400 can reliably protect the components of the display apparatus ED in the inner space from external impacts.

According to an embodiment, the electronic module 300 includes at least one of various functional modules that operate the display apparatus ED. The electronic module 300 includes at least one of components of the first electronic module EM1 or the second electronic module EM2.

According to an embodiment, the first electronic module EM1 is mounted directly on a motherboard electrically connected to the display module DD. Alternatively, the first electronic module EM1 is mounted on an additional board to be electrically connected to the motherboard through a connector.

According to an embodiment, the first electronic module EM1 includes a control module CM, a wireless communication module TM, an image input module IM, a sound input module AIM, a memory MM, and an external interface EF. In an embodiment, some of the components or modules are not mounted on the motherboard but are electrically connected to the motherboard through a flexible circuit board.

According to an embodiment, the control module CM controls the overall operations of the display apparatus ED. The control module CM includes a microprocessor. For example, the control module CM can activate or deactivate the display module DD. The control module CM controls other module(s), such as the image input module IM, the sound input module AIM, etc., on the basis of a touch signal received from the display module DD.

According to an embodiment, the wireless communication module TM transmits or receives a wireless signal to or from other terminal(s) using Bluetooth or Wi-Fi. The wireless communication module TM transmits or receives a voice signal using a general communication line. The wireless communication module TM includes a transmitter TM1 that can modulate a signal to be transmitted and transmit the modulated signal, and a receiver TM2 that can demodulate a received signal.

According to an embodiment, the image input module IM processes image signals to convert the image signals into image data usable in the display module DD. The sound input module AIM receives an external sound signal through a microphone m a recording mode or a voice recognition mode and converts the received sound signals into electrical sound data.

According to an embodiment, the external interface EF is connected to and interfaces with an external charger, a cable or wireless data port, or a card socket, such as a memory card or a SIM/UIM card.

According to an embodiment, the second electronic module EM2 includes a sound output module AOM, a light emitting module LM, a light receiving module LRM, and a camera module CMM. The components of the second electronic module EM2 may be mounted directly on the motherboard or be mounted on an additional board to be electrically connected to the display module DD or the first electronic module EM1 through a connector.

According to an embodiment, the sound output module AOM converts sound data received from the wireless communication module TM stored in the memory MM and outputs the converted sound data.

According to an embodiment, the light emitting module LM generates light and outputs the generated light. The light emitting module LM can output infrared light. The light emitting module LM includes a light emitting diode (LED) device. The light receiving module LRM senses infrared light. The light receiving module LRM is activated when sensing infrared light of a predetermined frequency or intensity, or more. The light receiving module LRM includes a CMOS sensor. After infrared light generated in the light emitting module LM is output, the infrared light can be reflected by an external object, such as a finger or a user's face, and the reflected infrared light is incident into the light receiving module LRM. The camera module CMM can acquire an image.

In an embodiment, the electronic module 300 illustrated in FIG. 2 is one of the components of the second electronic module EM2. In this case, the other components of the first and second electronic modules EM1 and EM2 are disposed at other positions. However, embodiments of the inventive concepts are not limited thereto. In other embodiments, the electronic module 300 can include one or more other components of the first and second electronic modules EM1 and EM2.

Figure 4A:
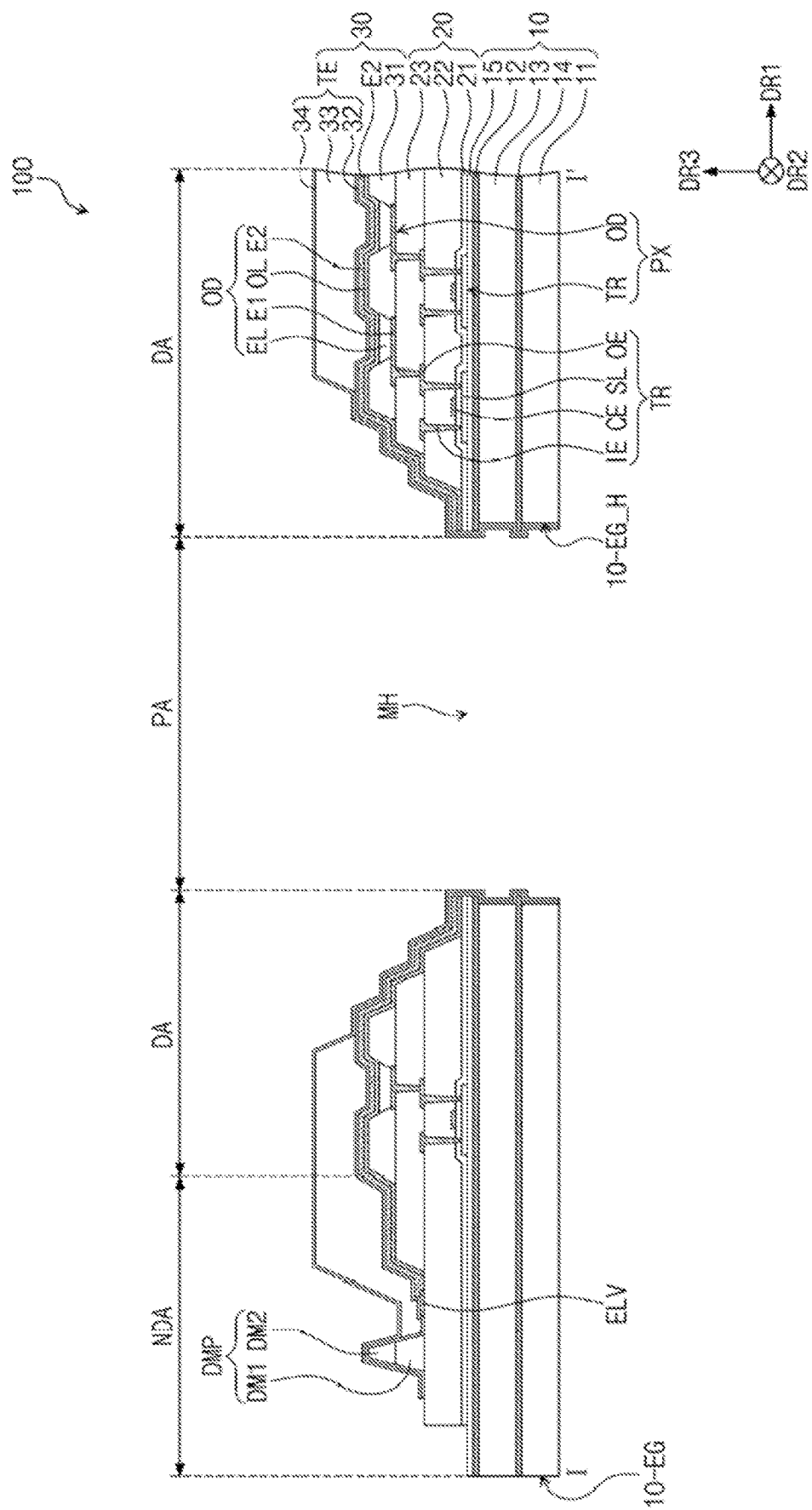
FIG. 4A is a cross-sectional view taken along a line I-I' of FIG. 2.
Figure 4B:
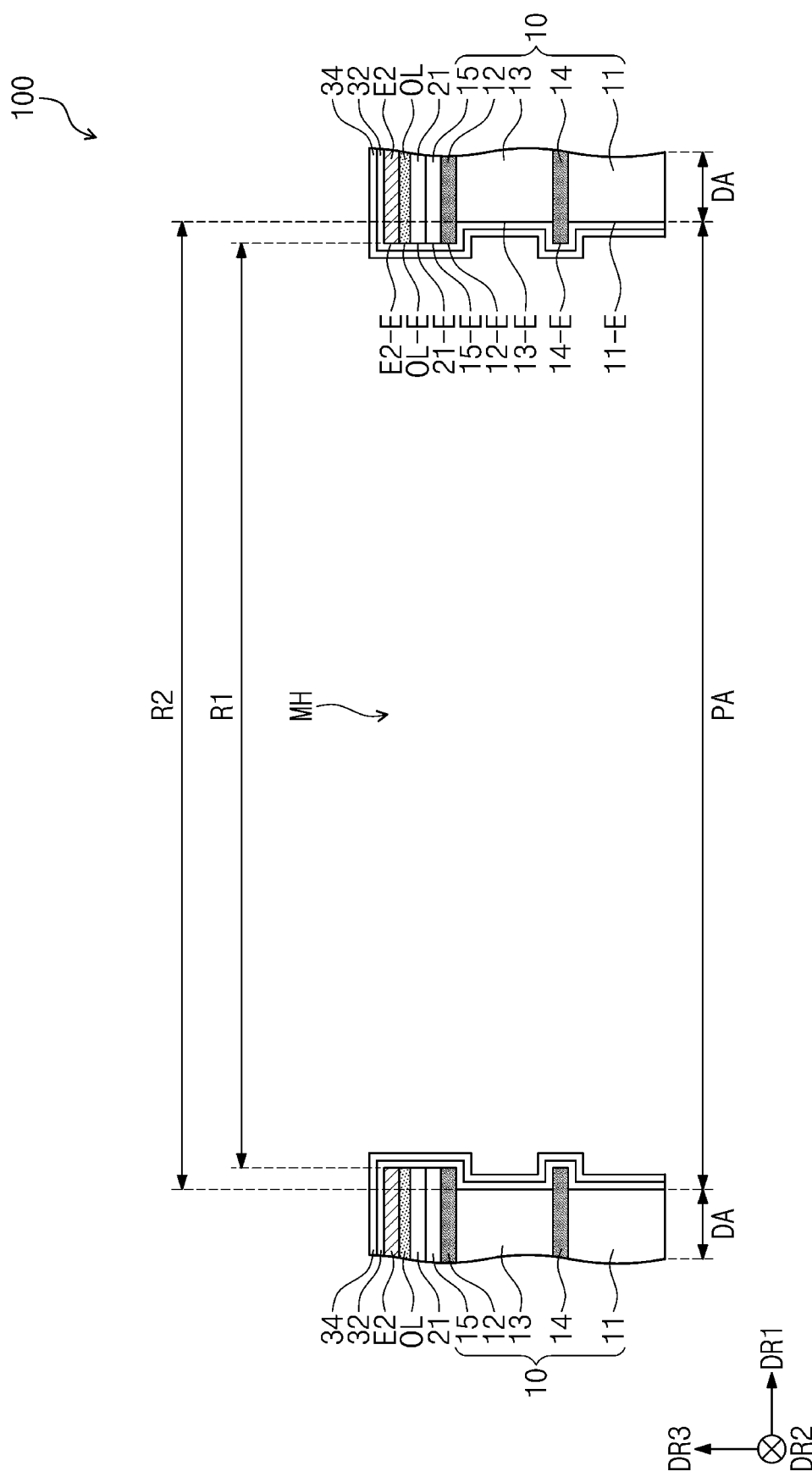
FIG. 4B is an enlarged cross-sectional view of a portion of FIG. 4A.

FIG. 4A is a cross-sectional view taken along a line I-I' of FIG. 2. FIG. 4B is an enlarged cross-sectional view of a portion of FIG. 4A. FIG. 4B is an enlarged view of the module hole MH for the purpose of ease and convenience in description. Hereinafter, an embodiment of the inventive concepts will be described in detail with reference to FIGS. 4A and 4B.

As illustrated in FIG. 4A, according to an embodiment, the display panel 100 include an insulating substrate 10, a thin film device layer 20, and a display device layer 30. The insulating substrate 10, the thin film device layer 20 and the display device layer 30 are stacked in the third direction DR3.

In an embodiment, the insulating substrate 10 includes a first base layer 11, a first barrier layer 12, a second base layer 13, a second barrier layer 14, and a buffer layer 15.

In an embodiment, the first base layer 11 is a lower layer of the insulating substrate 10. A rear surface of the first base layer 11 is a rear surface of the insulating substrate 10.

In an embodiment, the first base layer 11 is an insulating layer that includes an organic material. The first base layer 11 includes a flexible plastic. For example, the first base layer 11 may include polyimide (PI), polyethylene naphthalate (PEN), polyethylene terephthalate (PET), polyarylate, polycarbonate (PC), polyetherimide (PEI), or polyethersulfone (PES).

In an embodiment, the first barrier layer 12 includes an inorganic material. The first barrier layer 12 is an upper layer of the insulating substrate 10. A front surface of the first barrier layer 12 is a front surface of the insulating substrate 10.

In an embodiment, the first barrier layer 12 is an insulating layer that includes inorganic material. For example, the first barrier layer 12 may include silicon oxide, silicon nitride, or amorphous silicon.

In an embodiment, the second base layer 13 and the second barrier layer 14 are disposed between the first base layer 11 and the first barrier layer 12. The second base layer 13 includes the same material as the first base layer 11. The second barrier layer 14 includes the same material as the first barrier layer 12.

In an embodiment, the first and second base layers 11 and 13 and the second and first barrier layer 14 and 12 are alternately stacked. The first barrier layer 12 and the second barrier layer 14 are disposed on the second base layer 13 and the first base layer 11, respectively. In other words, the second barrier layer 14 is disposed between the first and second base layers 11 and 13. The first and second barrier layers 12 and 14 block external moisture or oxygen from diffusing through the first and second base layers 11 and 13.

In an embodiment, the buffer layer 15 is disposed on the first barrier layer 12. The buffer layer 15 covers a top or front surface of the first barrier layer 12. The buffer layer 15 includes an inorganic material. The buffer layer 15 has surface energy higher than that of the top surface of the first barrier layer 12. An adhesive strength of the buffer layer 15 to the thin film device layer 20, such as a semiconductor pattern SL car a first insulating layer 21 to be described below, is greater than that of the first barrier layer 12 to the thin film device layer 20. Thus, the thin film device layer 20 can be stably formed on the insulating substrate 10. However, embodiments of the inventive concepts are not limited thereto. In another embodiment, the buffer layer 15, the second barrier layer 14 and the second base layer 13 are omitted from the display panel 100.

In an embodiment, the thin film device layer 20 is disposed on the insulating substrate 10. The thin film device layer 20 includes a plurality of insulating layers and a thin film transistor TR. Each of the insulating layers includes an inorganic material or an organic material. The insulating layers include first to third insulating layers 21, 22 and 23.

In an embodiment, the thin film transistor TR includes a semiconductor pattern. SL, a control electrode CE, an input electrode IE, and an output electrode OE. The thin film transistor TR controls movement of charges in the semiconductor pattern SL by the control electrode CE to output an electrical signal, received from the input electrode IE, through the output electrode OE.

In an embodiment, the first insulating layer 21 is disposed between the semiconductor pattern SL and the control electrode CE. In a present embodiment, the control electrode CE is disposed on the semiconductor pattern SL. However, embodiments of the inventive concepts are not limited thereto. In another embodiment, the thin film transistor TR includes the semiconductor pattern SL disposed on the control electrode CE.

In an embodiment, the second insulating layer 22 is disposed between the control electrode CE and the input and output electrodes IE and OE. In other words, the input electrode IE and the output electrode OE are disposed on the second insulating layer 22. The input electrode IE and the output electrode OE both penetrate the first and second insulating layers 21 and 22 to be connected to portions of the semiconductor pattern SL, respectively. However, embodiments of the inventive concepts are not limited thereto. In another embodiment, the input electrode IE and the output electrode OE are connected directly to the semiconductor pattern SL.

In an embodiment, the third insulating layer 23 is disposed on the second insulating layer 22. The third insulating layer 23 covers the thin film transistor TR. The third insulating layer 23 electrically insulates the thin film transistor TR from the display device layer 30.

In an embodiment, the display device layer 30 includes an organic light emitting device OD and a plurality of insulating layers. The insulating layers of the display device layer 30 include a fourth insulating layer 31 and an encapsulation member TE.

In an embodiment, the fourth insulating layer 31 is disposed on the third insulating layer 23. A plurality of openings are formed in the fourth insulating layer 31. The organic light emitting device OD is provided in each of the openings.

In an embodiment, the organic light emitting device OD includes a first electrode E1, a second electrode E2, an emission layer EL, and a charge control layer OL. The first electrode E1 is disposed on the thin film device layer 20. The first electrode E1 penetrates the third insulating layer 23 to be electrically connected to the thin film transistor TR. A plurality of first electrodes E1 are provided. At least a portion of each of the first electrodes E1 is exposed by each of the openings.

In an embodiment, the second electrode E2 is disposed on the first electrode E1. The second electrode E2 has a single body that overlaps the plurality of first electrodes E1 and the fourth insulating layer 31. When a plurality of organic light emitting devices OD are provided, the second electrode E2 of the organic light emitting devices OD is supplied with the same voltage. Thus, an additional patterning process for forming the second electrode E2 can be omitted. However, embodiments of the inventive concepts are not limited thereto. In another embodiment, a plurality of second electrode E2 are provided, and the second electrodes E2 respectively correspond to the openings.

In an embodiment, the emission layer EL is disposed between the first electrode E1 and the second electrode E2. A plurality of emission layers EL are provided, and the plurality of emission layers EL are respectively disposed in the plurality of openings. The organic light emitting device OD activates the emission layer EL by a potential difference between the first and second electrodes E1 and E2 to generate light.

In an embodiment, the charge control layer OL is disposed between the first electrode E1 and the second electrode E2. The charge control layer OL is disposed adjacent to the emission layer EL. In a present embodiment, the charge control layer OL is disposed between the emission layer EL and the second electrode E2. However, embodiments of the inventive concepts are not limited thereto. In other embodiments, the charge control layer OL is disposed between the emission layer EL and the first electrode E1, or the charge control layer OL includes a plurality of layers stacked in the third direction DR3 with the emission layer EL interposed therebetween.

In a embodiment, the charge control layer OL has a single body that overlaps an entire top surface of the insulating substrate 10, without an additional patterning process. The charge control layer OL may be disposed in the openings and may also be disposed on a top surface of the fourth insulating layer 31.

In a present embodiment, the thin film transistor TR and the organic light emitting device OD constitute a pixel PX. An electrical signal received by the thin film transistor TR is transmitted to the organic light emitting device OD, and the organic light emitting device OD emits light that corresponds to the electrical signal. However, embodiments of the inventive concepts are not limited thereto. In other embodiments, the pixel PX includes two or more thin film transistors TR or two or more organic light emitting devices OD, or may further include a capacitor.

In an embodiment, the encapsulation member TE is disposed on the organic light emitting device OD. The encapsulation member TE includes an inorganic film or an organic film. In a present embodiment, the encapsulation member TE includes a first inorganic film 32, an organic film 33, and a second inorganic film 34.

In an embodiment, each of the first and second inorganic films 32 and 34 includes an inorganic material. For example, each of the first and second inorganic films 32 and 34 includes at least one of aluminum oxide, silicon oxide, silicon nitride, silicon oxynitride, silicon carbide, titanium oxide, zirconium oxide, or zinc oxide. The first inorganic film 32 and the second inorganic film 34 may include the same material or different materials from each other.

In an embodiment, the organic film 33 is disposed between the first inorganic film 32 and the second inorganic film 34. The organic film 33 includes an organic material. For example, the organic film 33 includes at least one of epoxy, polyimide (PI), polyethylene terephthalate (PET), polycarbonate (PC), polyethylene (PE), or polyacrylate.

In an embodiment, each of the first and second inorganic films 32 and 34 has a single body shape disposed on substantially an entire surface of the display panel 100. Each of the first and second inorganic films 32 and 34 partially overlaps the organic film 33. Thus, the first inorganic film 32 and the second inorganic film 34 are spaced apart from each other in the third direction DR3 with the organic film 33 interposed therebetween in one area and are in direct contact with each other in another area.

In addition, in an embodiment, the display panel 100 further includes a dam portion DMP. The dam portion DMP extends along an edge of the display area DA. The dam portion DMP surrounds the display area DA or is disposed at a side of the display area DA, such as a side of the display area DA adjacent to a pad or a driving circuit.

In an embodiment, the dam portion DMP includes a first dam DM1 and a second dam DM2. The first dam DM1 includes the same material as the third insulating layer 23. The first dam DM1 is simultaneously formed with the third insulating layer 23 and is disposed on the same layer as the third insulating layer 23.

In an embodiment, the second dam DM2 is stacked on the first dam DM1. The second dam DM2 includes the same material as the fourth insulating layer 31. The second dam DM2 is simultaneously formed with the fourth insulating layer 31 and is disposed on the same layer as the fourth insulating layer 31. However, embodiments of the inventive concepts are not limited thereto. In another embodiment, the dam portion DMP has a single layered structure.

In an embodiment, the dam portion DMP delimits an area into which a liquid organic material can flow in a process of forming the organic film 33. The organic film 33 is formed by an inkjet method in which the liquid organic material is applied onto the first inorganic film 32. The dam portion DMP forms a boundary of an area into which the liquid organic material can flow, and prevents the liquid organic material from overflowing out of the area bounded by dam portion DMP.

In addition, the display panel 100 according to an embodiment of the inventive concepts further includes an auxiliary electrode pattern ELV. The auxiliary electrode pattern ELV is disposed in the peripheral area NDA and is electrically connected to the second electrode E2 that extends from the display area DA. The auxiliary electrode pattern ELV transmits a stable power voltage received from an external source to the second electrode E2.

In a present embodiment, the auxiliary electrode pattern ELV is disposed between the second insulating layer 22 and the first inorganic film 32. The auxiliary electrode pattern ELV is disposed on the same layer as the input electrode IE and the output electrode OE. However, embodiments of the inventive concepts are not limited thereto. The auxiliary electrode pattern ELV may be disposed at one of other various positions.

Hereinafter, according to an embodiment, the hole area PA in which the module hole MH is formed will be described in detail with reference to FIGS. 4A and 4B. The module hole MN penetrates the display panel 100 in the third direction DR3. The hole area PA is substantially defined by formation of the module hole MH. In other words, since the module hole MH is formed in a portion of the display area DA, the hole area PA is an area surrounded by the display area DA in a plan view. The module hole MH penetrates the insulating substrate 10 and some of the layers of the display area DA.

In detail, according to an embodiment, the module hole MH penetrates the insulating substrate 10. An inner surface 10-EG_H of the module hole MH corresponds to the ends of a plurality of layers. The plurality of layers include the layers of the insulating substrate 10, one or some of the layers of the thin film device layer 20, and one or some of the layers of the display device layer 30.

According to an embodiment, an end 11-E of the first base layer, an end 12-E of the first barrier layer, an end 13-E of the second base layer, an end 14-E of the second barrier layer and an end 15-E of the buffer layer are defined at the first base layer 11, the first barrier layer 12, the second base layer 13, the second barrier layer 14 and the buffer layer 15 of the insulating substrate 10, respectively.

In a present embodiment, an undercut is formed at the inner surface 10-EG_H of the module hole MH. The undercut is formed in the insulating substrate 10. Thus, the end 11-E of the first base layer, the end 12-E of the first harrier layer, the end 13-E of the second base layer and the end 14-E of the second barrier layer may not be aligned with each other in the third direction DR3.

In more detail, according to an embodiment, the end 11-E of the first base layer and end 13-E of the second base layer are laterally recessed from the ends 12-E and 14-E of the first and second barrier layers and overlap with the first and second barrier layers 12 and 14, thereby forming the undercut.

According to an embodiment, the undercuts are formed between the first base layer 11 and the second harrier layer 14 and between the second base layer 13 and the first barrier layer 12. This is due to a difference in etching characteristics between the first and second barrier layers 12 and 14, which are formed of an inorganic material, and the first and second base layers 11 and 13, which are formed of an organic material. This will be described below in more detail.

In addition, in a present embodiment, the ends 11-E and 13-E of the first and second base layers are substantially straight and parallel to each other in the third direction DR3 when viewed in a cross-sectional view. Thus, a hole delimited by the end 11-E of the first base layer and a hole delimited by the end 13-E of the second base layer have substantially cylindrical shapes, and the undercuts form substantially right angles with the first and second barrier layers 12 and 14 that extend into the module hole MH. This is due to an etching process, which will be described below in detail.

According to an embodiment, the module hole MH also penetrates at least one of the layers of the thin film device layer 20 and at least one of layers of the display device layer 30. Ends are defined at the layers penetrated by the module hole MH. In a present embodiment, the module hole MH penetrates the first insulating layer 21 of the thin film device layer 20, and the charge control layer OL and the second electrode E2 of the display device layer 30. Thus, an end 21-E of the first insulating layer, an end OL-E of the charge control layer and an end E2-E of the second electrode are defined at the first insulating layer 21, the charge control layer OL and the second electrode E2, respectively.

According to an embodiment, the end 21-E of the first insulating layer, the end OL-E of the charge control layer and the end E2-E of the second electrode are substantially aligned with each other in the third direction DR3. The end 21-E of the first insulating layer, the end OLE of the charge control layer and the end E2-E of the second electrode are substantially aligned with the end 15-E of the buffer layer.

According to an embodiment, a hole defined by the end 21-E of the first insulating layer, the end OL-E of the charge control layer, the end E2-E of the second electrode and the end 15-E of the buffer layer have a first diameter R1. On the other hand, the holes defined by the ends 11-E and 13-E of the first and second base layers have a second diameter R2. The second diameter R2 is greater than the first diameter R1. Thus, the ends 11-E and 13-E of the first and second base layers are undercut from other layers, and at least one undercut is formed at the inner surface 10-EG_H of the module hole MH.

According to an embodiment, the first inorganic film 32 and the second inorganic film 34 extend into the hole area PA in which the module hole MH is disposed. The first and second inorganic films 32 and 34 extend into an area adjacent to the module hole MH and extend along the inner surface 10-EG_H of the module hole MH. Thus, the inner surface 10-EG_H of the module hole MH is covered by the first and second inorganic films 32 and 34.

According to an embodiment, the first and second inorganic films 32 and 34 cover the end 11-E of the first base layer, the end 12-E of the first barrier layer, the end 13-E of the second base layer, the end 14-E of the second harder layer, the end 15-E of the buffer layer, the end 21-E of the first insulating layer, the end OL-E of the charge control layer, and the end E2-E of the second electrode. The first and second inorganic films 32 and 34 cover both the undercut ends and the aligned ends.

According to an embodiment, ends cut and exposed by the module hole MH correspond to a path by which external oxygen or moisture can permeate. However, according to embodiments of the inventive concepts, the first and second inorganic films 32 and 34 cover the ends cut and exposed by the module hole MH, and thus external moisture or oxygen can be blocked.

Figure 5:
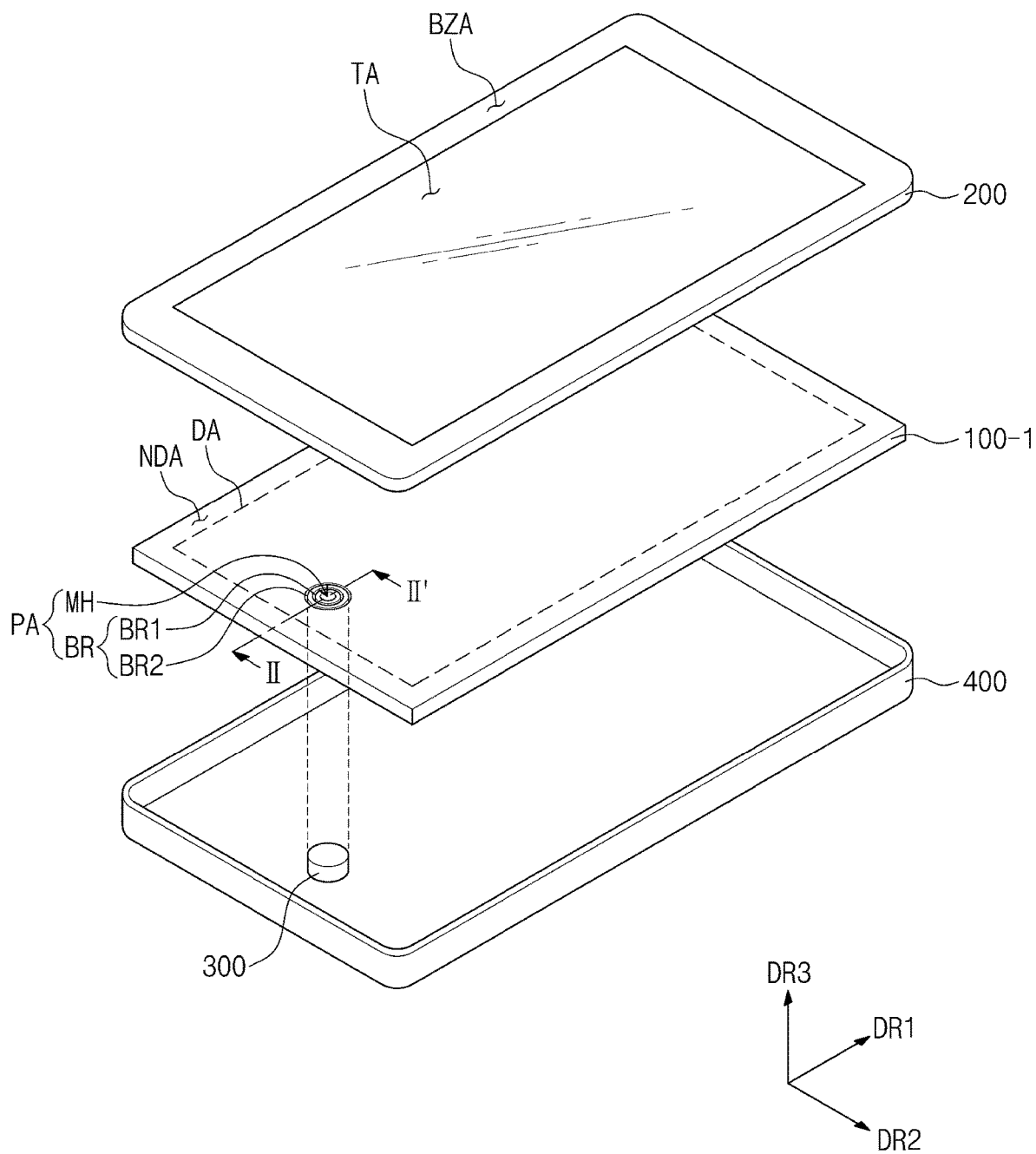
FIG. 5 is an exploded perspective view of a display apparatus according to an embodiment of the inventive concepts.
Figure 6A:
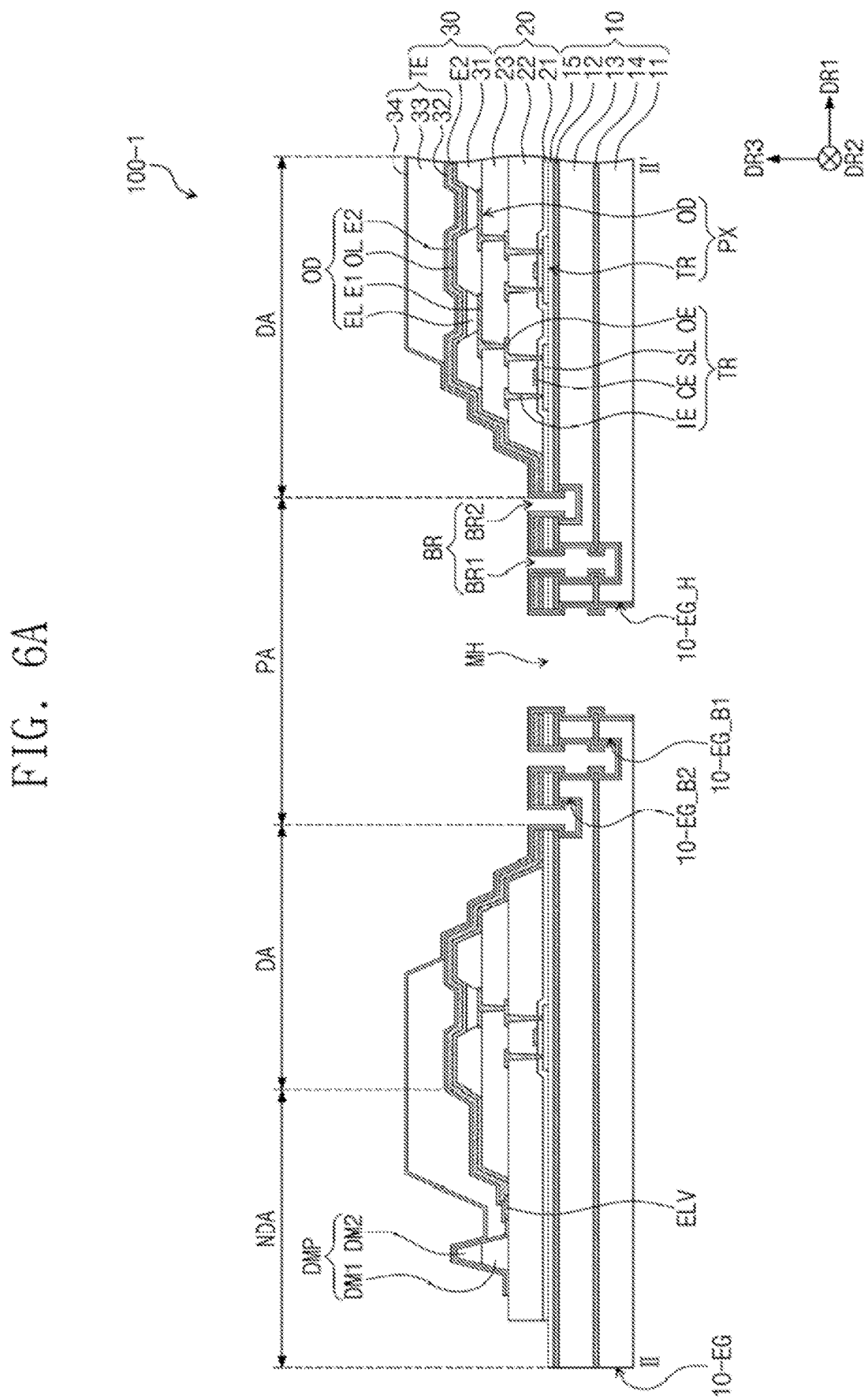
FIG. 6A is a cross-sectional view taken along a line II-II' of FIG. 5.
Figure 6B:
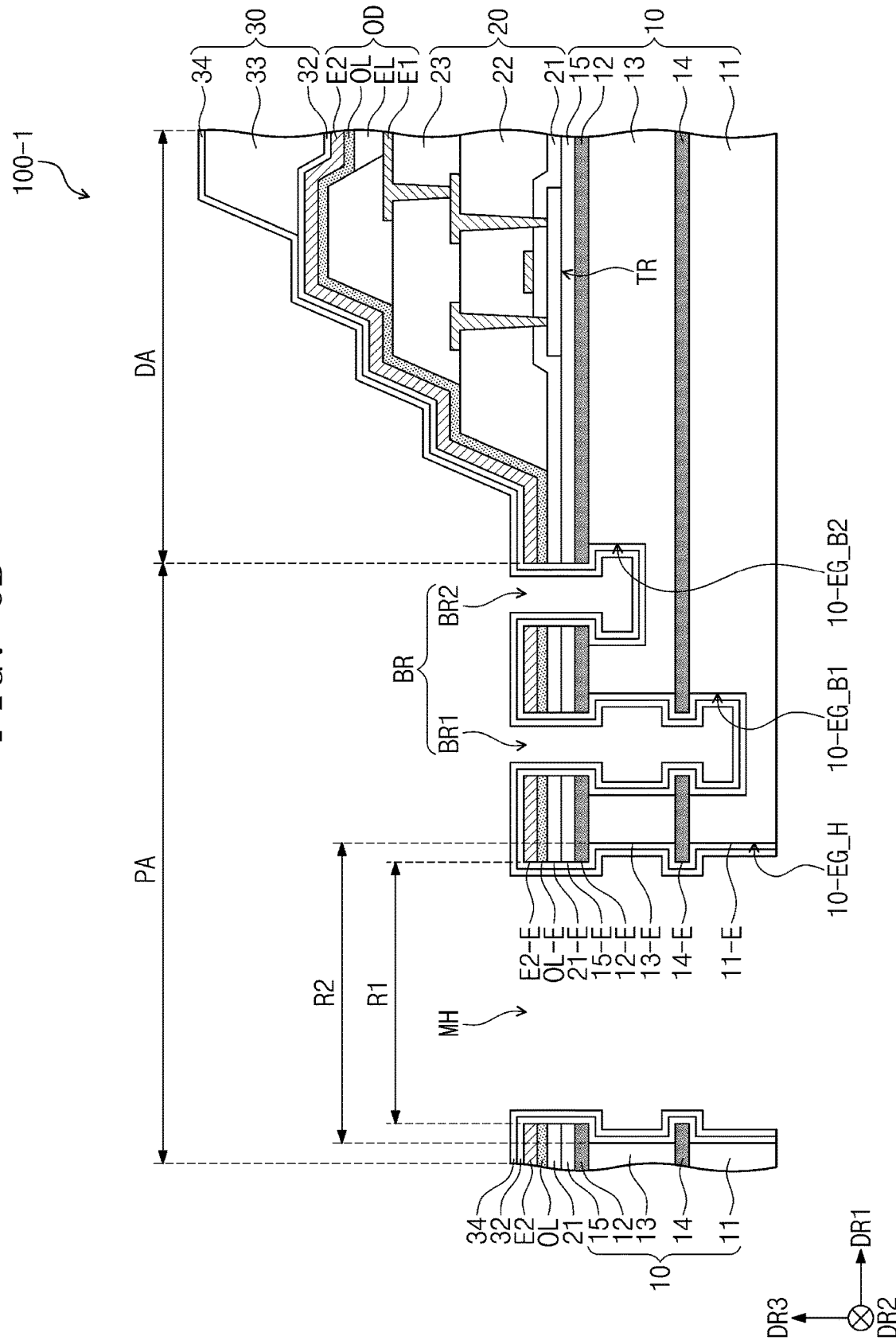
FIG. 6B is an enlarged cross-sectional view of a portion of FIG. 6A.

FIG. 5 is an exploded perspective view of a display apparatus according to an embodiment of the inventive concepts. FIG. 6A is a cross-sectional view taken along a line II-II' of FIG. 5. FIG. 6B is an enlarged cross-sectional view of a portion of FIG. 6A. Other components of a display apparatus of FIG. 5 may correspond to components of the display apparatus of FIG. 2 except for the hole area PA. Hereinafter, a present embodiment will be described with reference to FIGS. 5, 6A and B. In a present embodiment, the same components as described with reference to FIGS. 1 to 4B may be indicated by the same reference numerals or designators, and repetitive descriptions thereto will be omitted for the purpose of ease and convenience in description.

As illustrated in FIG. 5, according to an embodiment, a blocking recess BR is further provided in a hole area PA of a display panel 100-1. The blocking recess BR is adjacent to the module hole MH. The blocking recess BR is laterally spaced apart from the module hole MH.

According to an embodiment, the blocking recess BR is formed in the insulating substrate 10 and includes an inner surface that has an undercut shape. The blocking recess BR is recessed down from the front surface of the insulating substrate 10 in the third direction DR3. The blocking recess BR penetrates the front surface of the insulating substrate 10 but does not penetrate the rear surface of the insulating substrate 10.

According to an embodiment, the blocking recess BR includes a first blocking recess BR1 and a second blocking recess BR2. However, this case is exemplary and non-limiting. In other embodiments, the blocking recess BR has a single recess. However, embodiments of the inventive concepts are not limited to the number of the blocking recesses BR.

According to an embodiment, the blocking recess BR is formed by removing a portion of the insulating substrate 10. In detail, the blocking recess BR is formed by removing portions of the first base layer 11, the first barrier layer 12, the second base layer 13 and the second barrier layer 14. In a present embodiment, the one or some of layers removed to form the first blocking recess BR1 may differ from the layers removed to form the second blocking recess BR2.

According to an embodiment, the first blocking recess BR1 is closer to the module hole MH than the second blocking recess BR2. In other words, the first blocking recess BR1 is disposed between the module hole MH and the second blocking recess BR2. The first blocking recess BR1 and the second blocking recess BR2 form concentric circles around the module hole MH. The first blocking recess BR1 is formed by removing portions of the first base layer 11, the first barrier layer 12, the second base layer 13, the second barrier layer 14, the buffer layer 15 and the first insulating layer 21. The first blocking recess BR1 is a hole that penetrates the first barrier layer 12, the second base layer 13 and the second barrier layer 14, the buffer layer 15, the first insulating layer 21 and a recessed portion in the first base layer 11.

According to an embodiment, the second blocking recess BR2 is closer to the display area DA than the first blocking recess BR1. The second blocking recess BR2 is formed by removing portions of the first barrier layer 12, the second base layer 13, the buffer layer 15 and the first insulating layer 21. The second blocking recess BR2 is a hole that penetrates the first barrier layer 12, the buffer layer 15, the first insulating layer 21 and a recessed portion in the second base layer 13. The second blocking recess BR2 does not reach the second barrier layer 14 and the first base layer 11.

According to an embodiment of the inventive concepts, a depth of the first blocking recess BR1 differs from a depth of the second blocking recess BR2. The depth of the second blocking recess BR2 is less than the depth of the first blocking recess BR1. However, embodiments of the inventive concepts are not limited thereto. In other embodiments, the first and second blocking recesses BR1 and BR2 have the same shape and the same depth, or the depth of the second blocking recess BR2 is greater than the depth of the first blocking recess BR1. The shape of the blocking recess BR according to embodiments of the inventive concepts may be variously modified.

According to an embodiment, the charge control, layer OL extends into an area adjacent to the module hole MH and an area adjacent to the blocking recess BR. The charge control layer OL does not overlap the blocking recess BR. Thus, the charge control layer OL has a cut end adjacent to the blocking recess BR.

According to an embodiment, the second electrode E2 extends into an area adjacent to the module hole MH and an area adjacent to the blocking recess BR. The second electrode E2 does not overlap the blocking recess BR. Thus, the second electrode E2 has a cut end adjacent to the blocking recess BR.

According to an embodiment, the first inorganic film 32 and the second inorganic film 34 extend into the area in which the blocking recess BR is formed. The first and second inorganic films 32 and 34 are disposed in the area adjacent to the blocking recess BR and extend along inner surfaces 10-EG_B1 and 10-EG_B2 of the blocking recess BR. Thus, the inner surfaces 10-EG_B1 and 10-EG_B2 of the blocking recess BR are covered by the first and second inorganic films 32 and 34.

According to an embodiment of the inventive concepts, the charge control layer OL has a cut end adjacent to the blocking recess BR and does not overlap the blocking recess BR. The cut end of the charge control layer OL adjacent to the blocking recess BR is covered by the first inorganic film 32 and the second inorganic film 34.

According to an embodiment of the inventive concepts, the second electrode E2 has a cut end adjacent to the blocking recess BR and does not overlap the blocking recess BR. The cut end of the second electrode E2 adjacent to the blocking recess BR is covered by the first inorganic film 32 and the second inorganic film 34.

According to the embodiment of the inventive concepts, since the blocking recess BR is adjacent to the module hole MH, moisture or oxygen can be blocked from permeating from the module hole MH. The charge control layer OL and the second electrode E2 of which ends are exposed by the module hole MH are separated from the charge control layer OL and the second electrode E2 of the display area DA by the blocking recess BR. The blocking recess BR separates portions of the charge control layer OL and the second electrode E2 disposed between the module hole MH and the blocking recess BR from other portions of the charge control layer OL and the second electrode E2 disposed outside the blocking recess BR. Thus, even though external moisture or oxygen is are present in the module hole MH, the external moisture or oxygen do not diffuse past the blocking recess BR. As a result, it is possible to prevent damage to the thin film device layer 20 or the display device layer 30 disposed outside the blocking recess BR.

In addition, according to an embodiment of the inventive concepts, the first inorganic film 32 and the second inorganic film 34 cover portions between the module hole MH and the blocking recess BR, the inside of the blocking recess BR, and the portion outside the blocking recess BR. In other words, the charge control layer OL, the second electrode E2, the first insulating layer 21, and the buffer layer 15, which are adjacent to the blocking recess BR and cut, are covered by the first inorganic film 32 and the second inorganic film 34. Thus, external moisture or oxygen can be further blocked.

Figure 7:
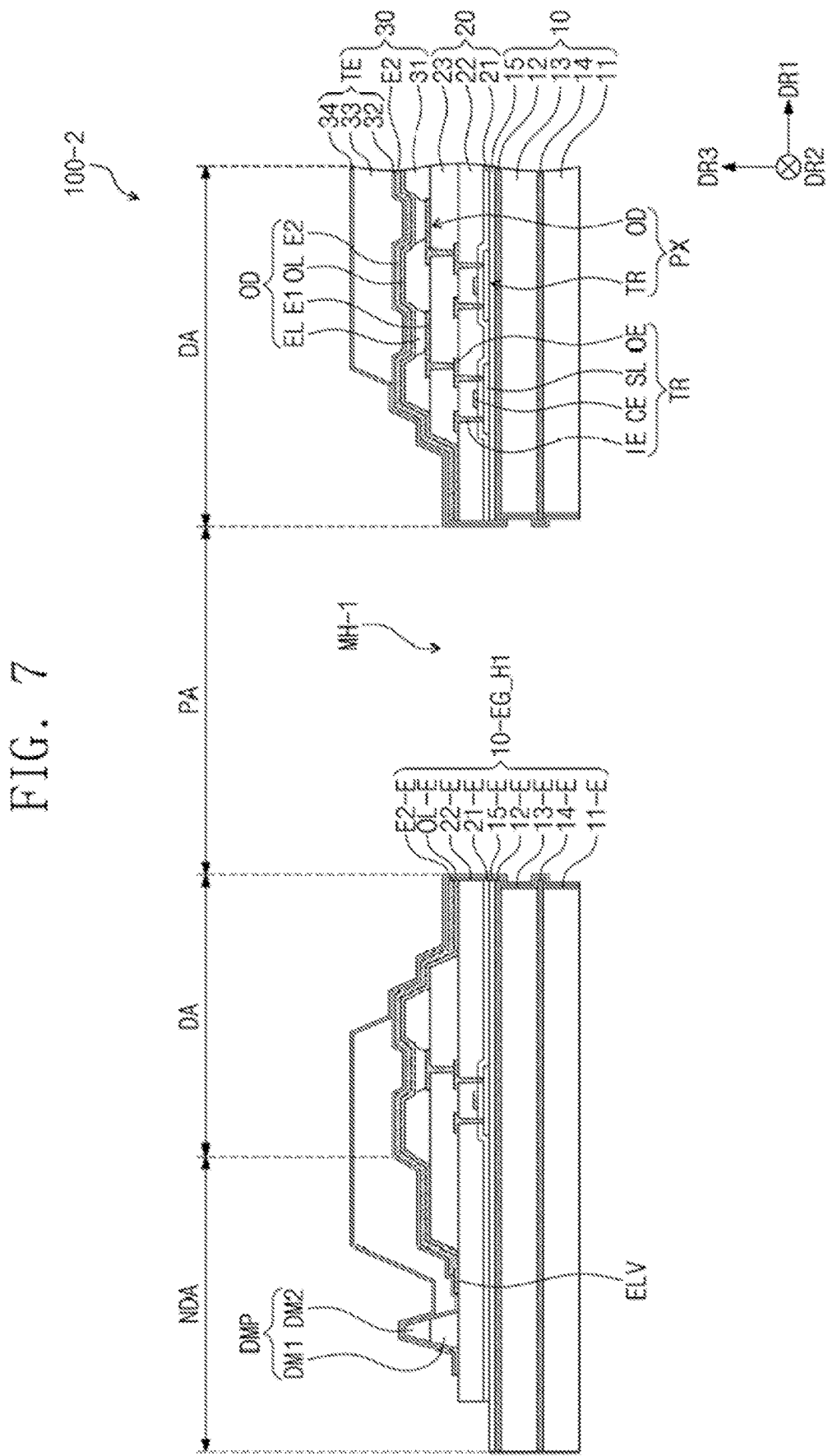
FIG. 7 is a cross-sectional view of a portion of a display panel according to an embodiment of the inventive concepts.

FIG. 7 is a cross-sectional view of a portion of a display panel according to an embodiment of the inventive concepts. FIG. 7 illustrates an area of FIG. 4A for the purpose of ease and convenience in description. Hereinafter, a display panel 100-2 according to an embodiment of the inventive concepts will be described with reference to FIG. 7. In a present embodiment, the same components as described with reference to FIGS. 1 to 6B may be indicated by the same reference numerals or designators, and repetitive descriptions there will be omitted for the purpose of ease and convenience in description.

As illustrated in FIG. 7, according to an embodiment, a module hole MH-1 penetrates the second insulating layer 22. An inner surface 10-EG_H1 of the module hole MH-1 includes the ends 11-E, 12-E, 13-E, 14-E and 15-E of the insulating substrate 10, the end 21-E of the first insulating layer, an end 22-E of the second insulating layer, the end OL-E of the charge control layer, and the end E2-E of the second electrode. In other words, the second insulating layer 22 extends into the hole area PA and is cut by the module hole MH-1, unlike the display panel 100 illustrated in FIG. 4A.

According to an embodiment, the first and second inorganic films 32 and 34 cover the exposed end 22-E of the second insulating layer. A depth of the module hole MH-1 is increased by a thickness of the second insulating layer 22, as compared with the module hole MH illustrated in FIG. 4A.

According to embodiments of the inventive concepts, the module hole MH-1 penetrates various layers. The module hole MH-1 penetrates the insulating substrate 10 to include the undercut inner surfaces and penetrates various layers disposed under the charge control layer OL. According to an embodiment of the inventive concepts, since the module hole MH-1 penetrates the second insulating layer 22 disposed under the charge control layer OL, the charge control layer OL on the second insulating layer 22 and the second electrode E2 on the charge control layer OL are cut by the module hole MH-1. Thus, the first and second inorganic films 32 and 34 cover the cut ends OL-E and E2-E of the charge control layer OL and the second electrode E2, respectively, to prevent the charge control layer OL and the second electrode E2 from external contact.

Figure 8A:
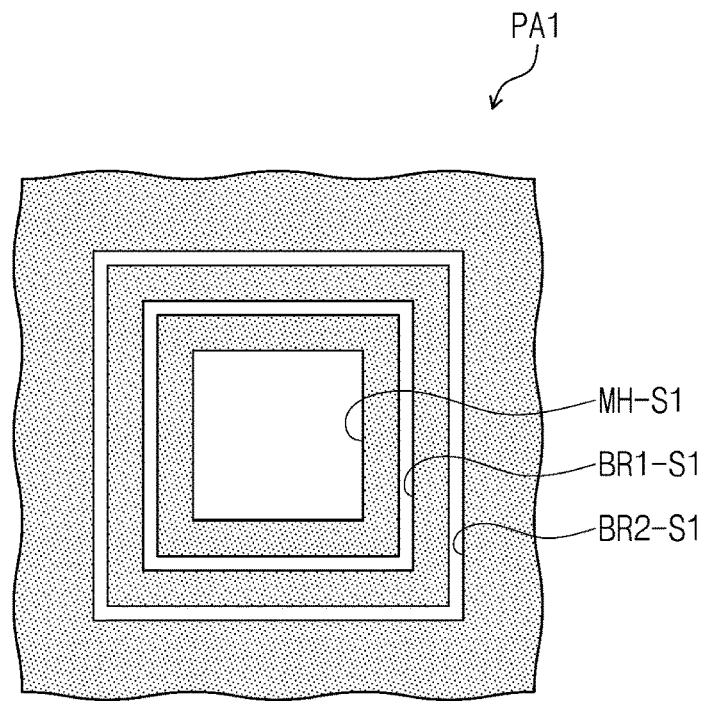
FIGS. 8A to 8C are plan views of hole areas according to some embodiments of the inventive concepts.
Figure 8B:
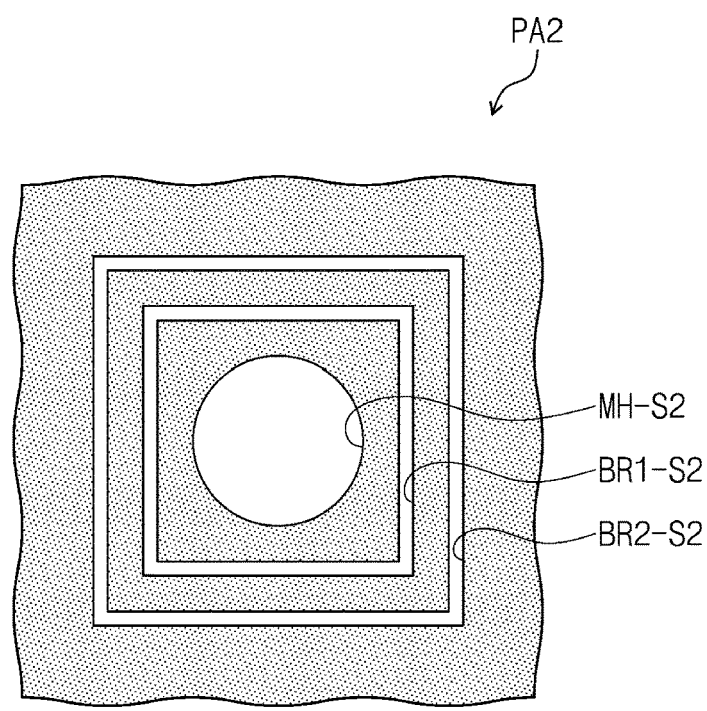
Figure 8C:
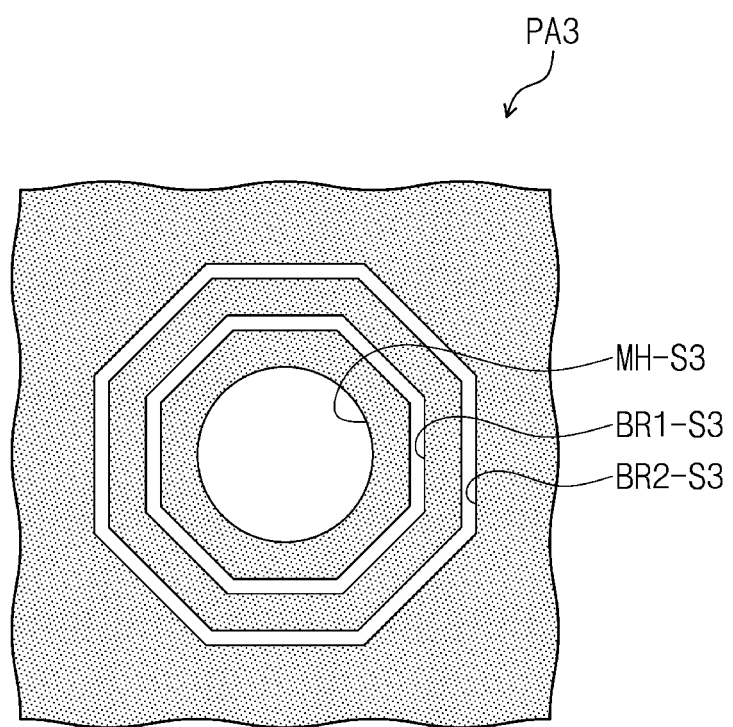

FIGS. 8A to 8C are plan views of hole areas according to some embodiments of the inventive concepts. In FIGS. 8A to 8C, some components that corresponding to hole areas PA1, PA2 and PA3 are hatched for the purpose of ease and convenience in description. Hereinafter, some embodiments of the inventive concepts will be described with reference to FIGS. 8A to 8C.

As illustrated in FIG. 8A, according to an embodiment, a hole area PA1 includes a module hole MH-S1 and one or more blocking recesses BR1-S1 and BR2-S1. The module hole MH-S1 has a polygonal shape when viewed in a plan view. In a present embodiment, the module hole MH-S1 has a quadrilateral shape. In this case, the module hole MH-S1 has a hollow polygonal pillar shape.

According to an embodiment, the blocking recesses BR1-S1 and BR2-S1 are formed along an edge of the module hole MH-S1. The blocking recesses BR1-S1 and BR2-S1 have shapes that correspond to the shape of the module hole MH-S1. Thus, the blocking recesses BR1-S1 and BR2-S1 have concentric quadrilateral ring shapes that surround the module hole MH-S1 when viewed in a plan view.

Alternatively, according to an embodiment, as illustrated in FIG. 8B, a hole area PA2 includes a module hole MH-S2 and one or more blocking recesses BR1-S2 and BR2-S2 that have different shapes from that of the module hole MH-S2. The module hole MH-S2 has a circular shape when viewed in a plan view. The blocking recesses BR1-S2 and BR2-S2 have shapes that differ from the shape of the module hole MH-S2. In a present embodiment, the blocking recesses BR1-S2 and BR2-S2 have quadrilateral ring shapes. According to some embodiments of the inventive concepts, the blocking recesses BR1-S2 and BR2-S2 have one of various shapes concentric about the module hole MH-S2. In other words, according to embodiments of the inventive concepts, the shapes of the blocking recesses are not limited to correspond to the shape of the module hole.

As illustrated in FIG. 8C, according to an embodiment, a hole area PA3 includes a module hole MH-S3 and one or more blocking recesses BR1-S3 and BR2-S3 that have different shapes from that of the module hole MH-S3. In a present embodiment, the blocking recesses BR1-S3 and BR2-S3 have concentric octagonal ring shapes. As the shapes of the blocking recesses BR1-S3 and BR2-S3 become more similar to the shape of the module hole MH-S3, an area of a spaces between the module hole MH-S3 and the blocking recesses BR1-S3 and BR2-S3 is reduced. Thus, an area occupied by the bole area PA3 in the display area DA can be reduced to reduce an influence of the hole area PA3 on the display area DA.

FIGS. 9A to 9M are cross-sectional views that illustrate a method of manufacturing a display panel, according to an embodiment of the inventive concepts. FIGS. 9A to 9M illustrate a method of manufacturing a display panel 100-2 illustrated in FIG. 7. Hereinafter, a manufacturing method according to an embodiment of the inventive concepts will be described with reference to FIGS. 9A to 9M.

Figure 9A:
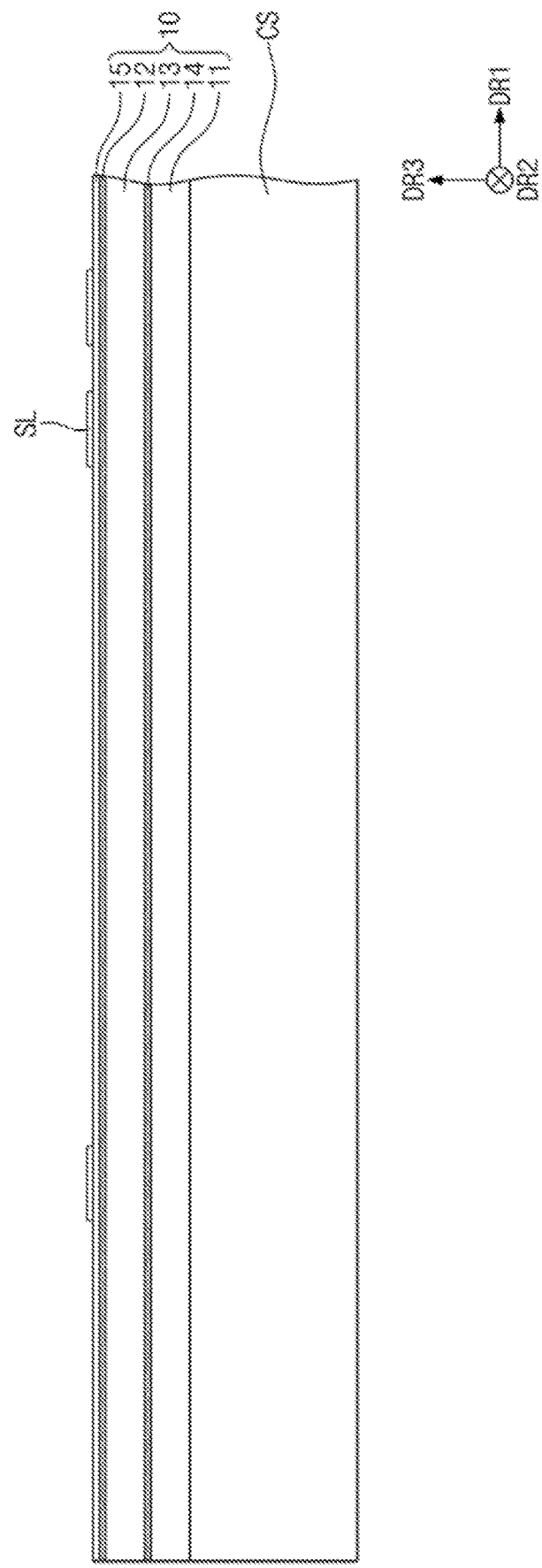
FIGS. 9A to 9M are cross-sectional views of a method of manufacturing a display panel, according to an embodiment of the inventive concepts.

Referring to FIG. 9A, according to an embodiment, an insulating substrate 10 is formed on a carrier substrate CS, and a semiconductor pattern SL is formed on the insulating substrate 10. A plurality of semiconductor patterns SL are formed. In detail, a semiconductor material is formed on the buffer layer 15 of the insulating substrate 10, and then, a patterning process is performed on the semiconductor material to form the semiconductor patterns SL.

Figure 9B:
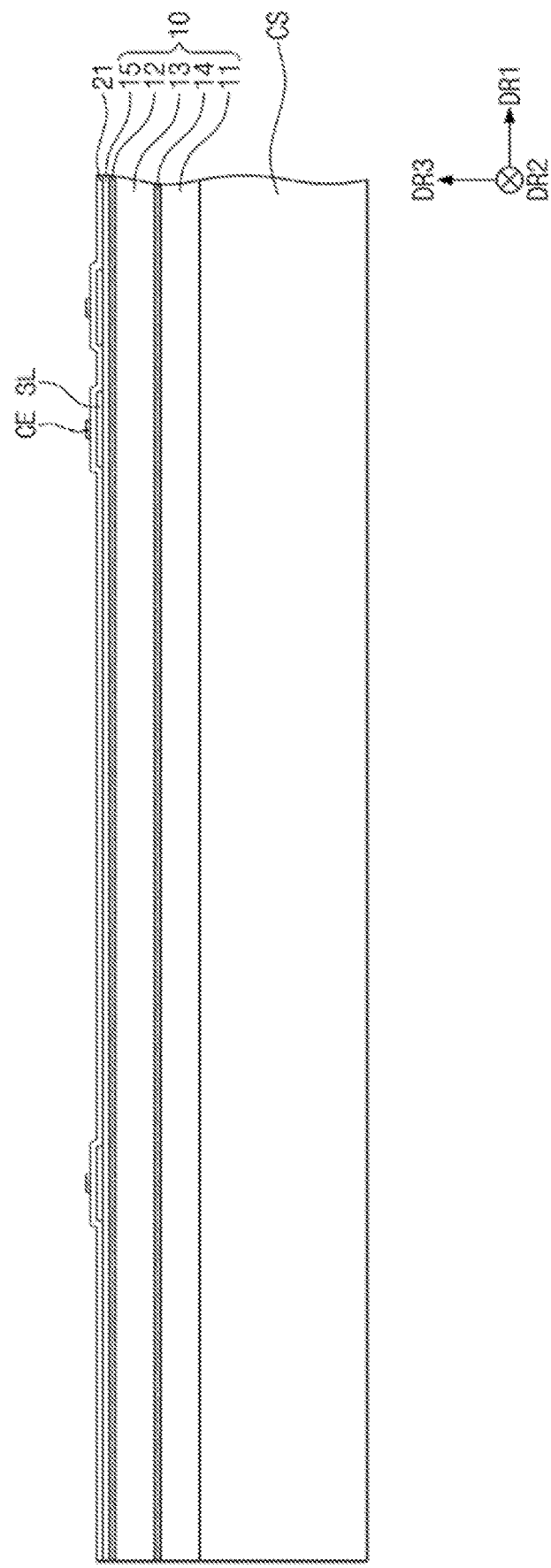

Referring to FIG. 9B, according to an embodiment, a first insulating layer 21 and a control electrode CE are sequentially formed on the insulating substrate 10. The first insulating layer 21 is formed by covering the semiconductor pattern SL with an insulating material. The first insulating layer 21 is formed by depositing an inorganic material. The first insulating layer 21 is thrilled on an entire top surface of the insulating substrate 10.

According to an embodiment, a conductive material is formed on the first insulating layer 21, and then, a patterning process is performed on the conductive material to form the control electrode CE. A plurality of control electrodes CE are formed, and the control electrodes CE overlap the semiconductor patterns SL, respectively.

Figure 9C:
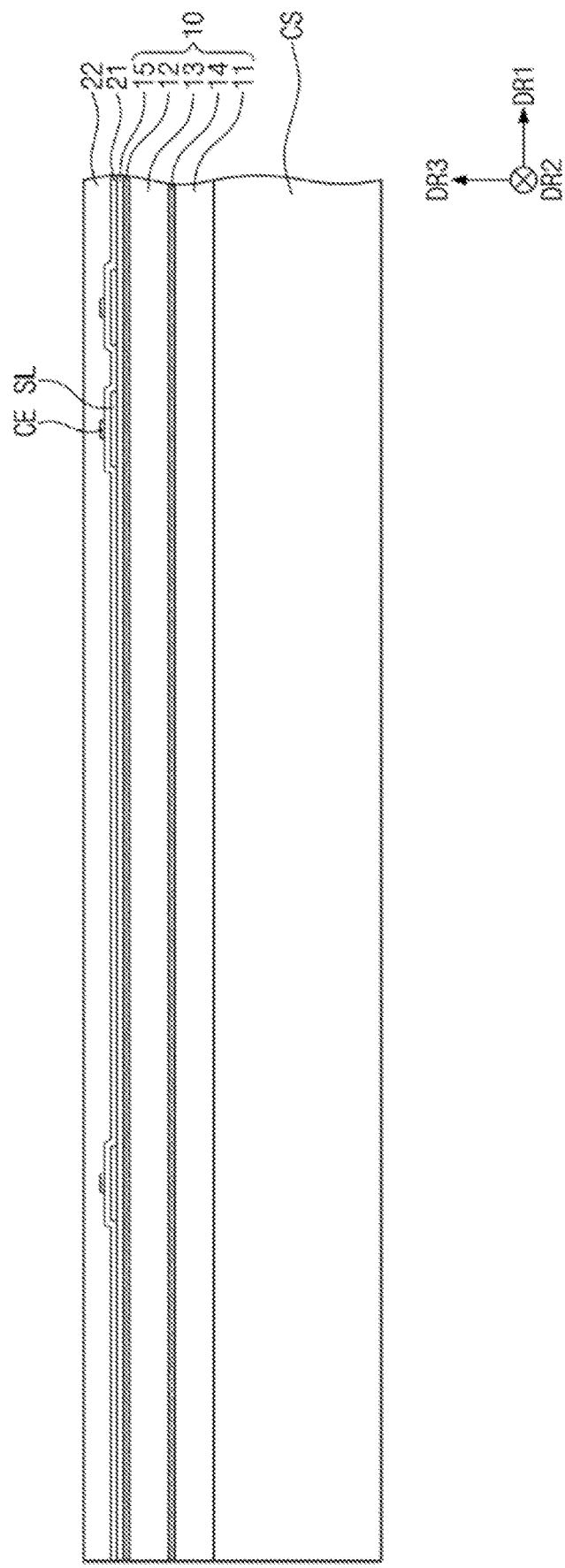

Referring to FIG. 9C, according to an embodiment, a second insulating layer 22 is formed on the insulating substrate 10. The second insulating layer 22 is formed by depositing an insulating material on the entire top surface of the insulating substrate 10. The second insulating layer 22 covers the control electrode CE and is formed on an entire top surface of the first insulating layer 21. The second insulating layer 22 is formed of an inorganic material and may have a single-layered structure or a multi-layered structure that includes a plurality of stacked layers.

Figure 9D:
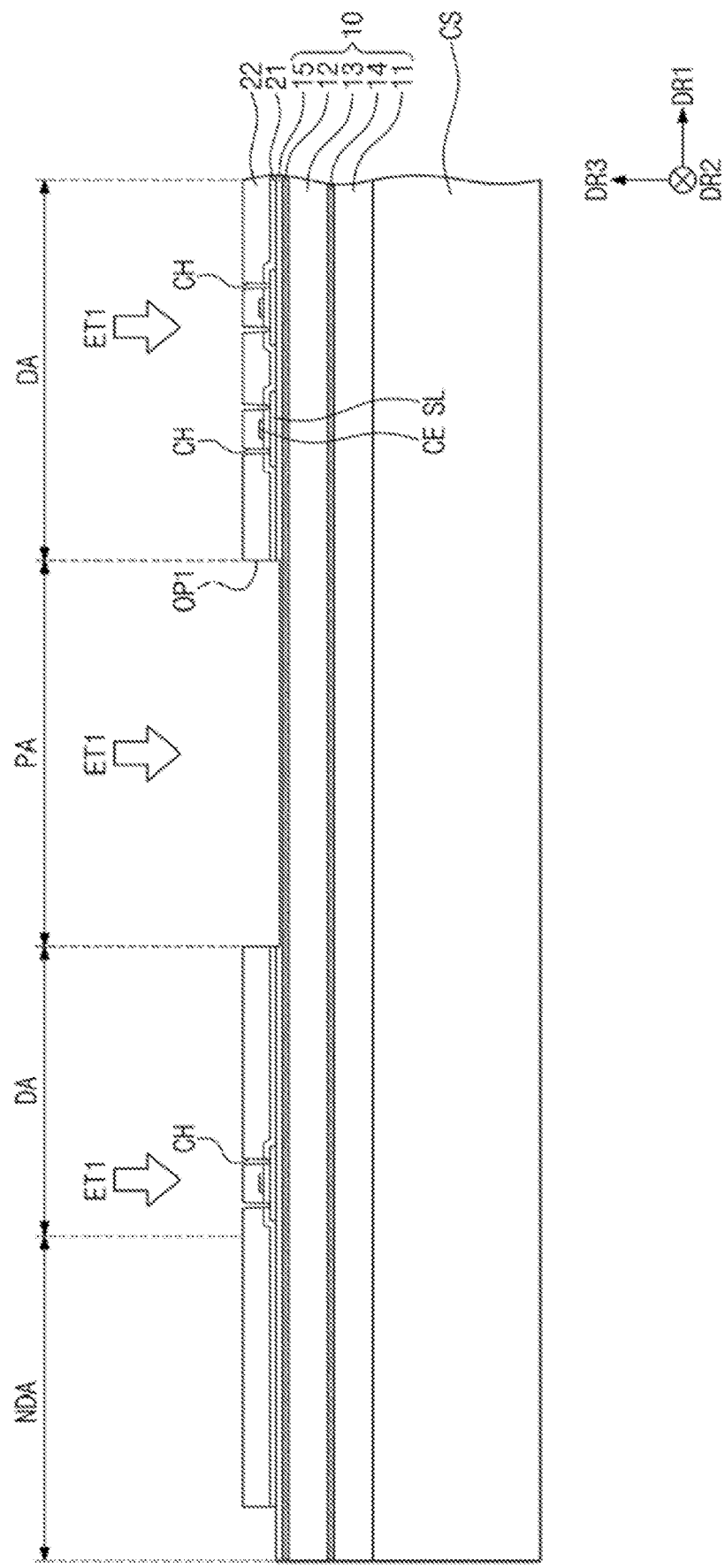

Referring to FIG. 9D, according to an embodiment, a first etching gas ET1 is provided to form a plurality of contact holes CH and a first opening OP1 in the first and second insulating layers 21 and 22. In the present embodiment, the first opening OP1 and the contact holes CH are formed at the same time by the first etching gas ET1.

According to an embodiment, the contact holes CH are formed in the display area DA. The contact holes CH overlap the semiconductor pattern SL to expose portions of the semiconductor pattern SL. The first opening OP1 are formed in the hole area PA. The first opening OP1 penetrates the first and second insulating layers 21 and 22 to expose the buffer layer 15. In addition, a portion of the buffer layer 15 is removed by the first etching gas ET1 due to the materials of the first etching gas ET1 and the buffer layer 15, and thus the buffer layer 15 is relatively thin in the hole area PA.

Figure 9E:
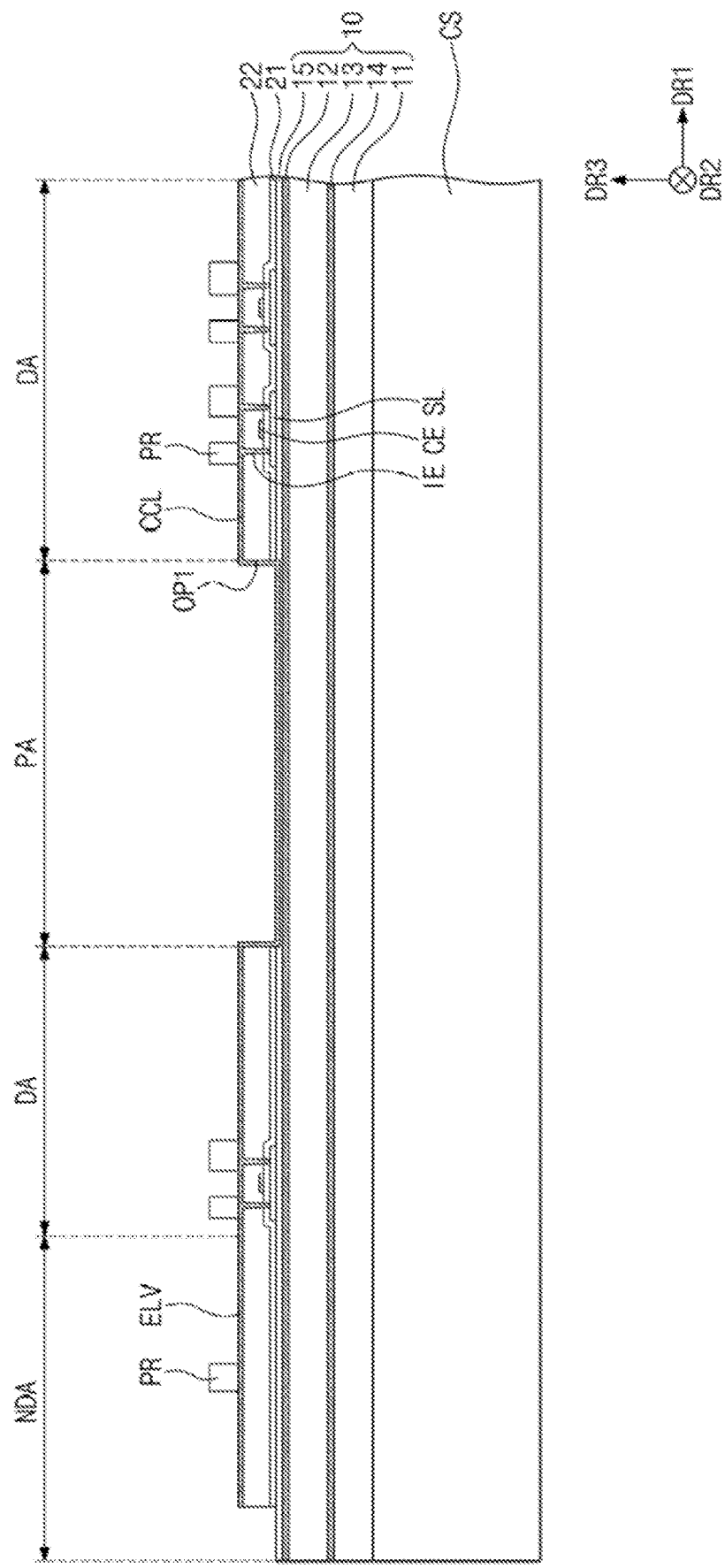

Referring to FIG. 9E, according to an embodiment, a conductive layer CLL a a photoresist pattern PR are sequentially formed on the insulating substrate 10. The conductive layer CLL is formed by depositing a conductive material on the second insulating layer 22. Thus, the conductive layer CLL covers a top surface of the second insulating layer 22, inner surfaces of the contact holes CH, and an inner surface of the first opening OP1.

According to an embodiment, the photoresist pattern PR is formed on the conductive layer CLL. A top surface of the conductive layer CLL is coated with a photoresist material, and then, the photoresist material is patterned through a photolithography process to form the photoresist pattern PR. The photoresist pattern PR is formed in the display area DA and is formed to correspond to each of the contact holes CH.

In addition, in a present embodiment, the photoresist pattern PR is also formed in the peripheral area NDA. The photoresist pattern PR in the peripheral area NDA functions as a mask for patterning an auxiliary electrode pattern ELV to be described below.

Figure 9F:
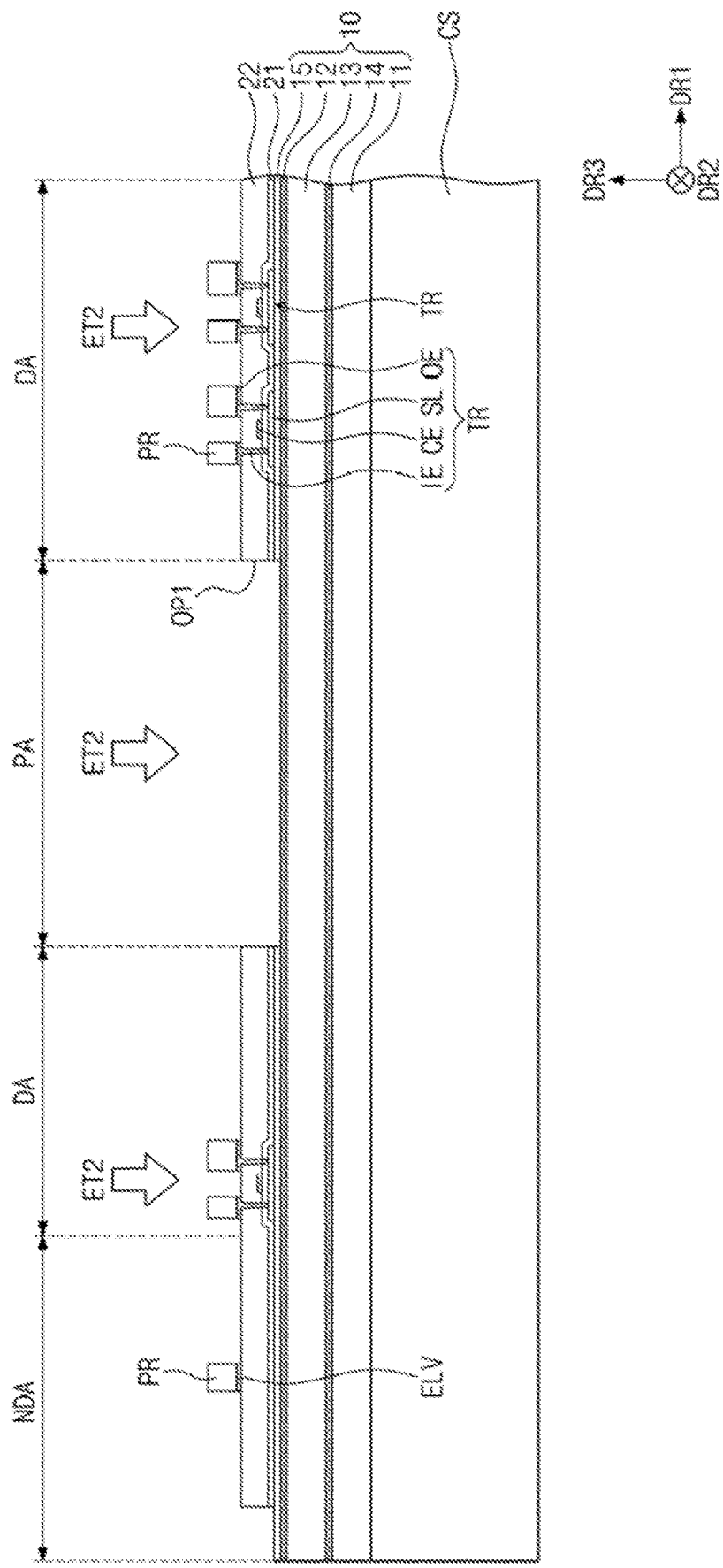

Referring to FIG. 9F, according to an embodiment, after forming the photoresist patterns PR, a second etching gas ET2 is provided to form an input electrode IE and an output electrode OE from the conductive layer CLL. The second etching gas ET2 reacts with portions of the conductive layer CLL exposed by the photoresist patterns PR to remove the exposed portions of the conductive layer CLL from the insulating substrate 10. Thus, portions of the conductive layer CLL which fill the contact holes CH under the photoresist patterns PR remains and the second insulating layer 22 is exposed by the removal of the exposed portions of the conductive layer CLL. At this time, the remaining portions of the conductive layer CLL that fill the contact holes CH correspond to the input electrode IE and the output electrode OE. A portion of the conductive layer CLL that covers the inner surface of the first opening OP1 is also removed by the second etching gas ET2 to expose the inner surface of the first opening OP1. In addition, an auxiliary electrode pattern ELV is formed under the photoresist pattern PR in the peripheral area NDA.

Figure 9G:
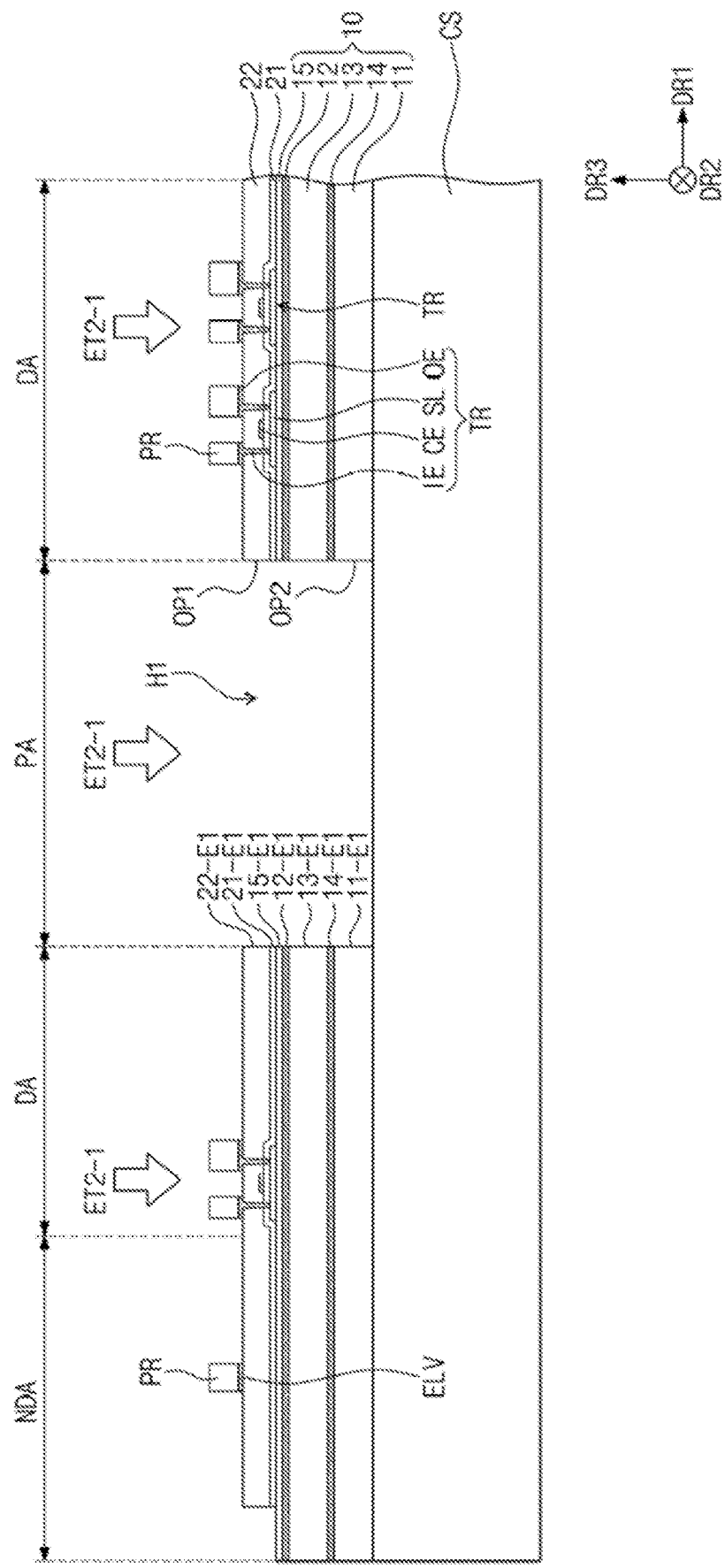

Referring to FIG. 9G, according to an embodiment, an additional etching gas ET2-1 is provided to form a second opening OP2 in the hole area PA. The second opening OP2 is formed by removing a portion of the insulating substrate 10, which overlaps the first opening OP1. In detail, the second opening OP2 is formed by removing portions of the first base layer 11, the first barrier layer 12, the second base layer 13, the second barrier layer 14 and the buffer layer 15, which overlap the hole area PA. A portion of the carrier substrate CS is exposed by the second opening OP2.

According to an embodiment, the first opening OP1 and the second opening OP2 are connected to each other in the third direction DR3 to form a first hole H1. The first hole H1 penetrates the insulating substrate 10 and a plurality of the insulating layers 21 and 22. The first hole H1 is bounded by an end 11-E1 of the first base layer, an end 12-E1 of the first barrier layer, an end 13-E1 of the second base layer, an end 14-E1 of the second barrier layer, an end 15-E1 of the buffer layer, an end 21-E1 of the first insulating layer, and an end 22-E1 of the second insulating layer. The etching process that uses the additional etching gas ET2-1 is an anisotropic etching process. Thus, the end 11-E1 of the first base layer, the end 12-E1 of the first harrier layer, the end 13-E1 of the second base layer, the end 14-E1 of the second barrier layer, the end 15-E1 of the buffer layer, the end 21-E1 of the first insulating layer, and the end 22-E1 of the second insulating layer are aligned with each other in the third direction DR3.

In a present embodiment, the first and second insulating layers 21 and 22 that have the first opening OP1 function as a mask or forming the second opening OP2. Thus, the additional etching gas ET2-1 includes a material that has a low reactivity with the first or second insulating layer 21 or 22 and a high reactivity with the insulating substrate 10.

According to an embodiment, the additional etching gas ET2-1 includes the same material as the second etching gas ET2. When the second etching gas ET2 has a high reactivity with the insulating substrate 10 and a low reactivity with the second or first insulating layers 22 or 21, the first hole H1 is firmed by providing the second etching gas ET2 for a longer period of time. Thus, the first hole H1 is easily formed without an additional process.

Alternatively, according to an embodiment, the additional etching gas ET2-1 includes a different material from that of the second etching gas ET2. In this case, the additional etching gas ET2-1 includes a material for which a reactivity with the insulating substrate 10 is higher than a reactivity of the second etching gas ET2 with the insulating substrate 10. Thus, even though the second etching gas ET2 has a low reactivity with the Insulating substrate 10, the first hole H1 is easily formed by changing the second etching gas ET2 into the additional etching gas ET2-1.

Figure 9H:
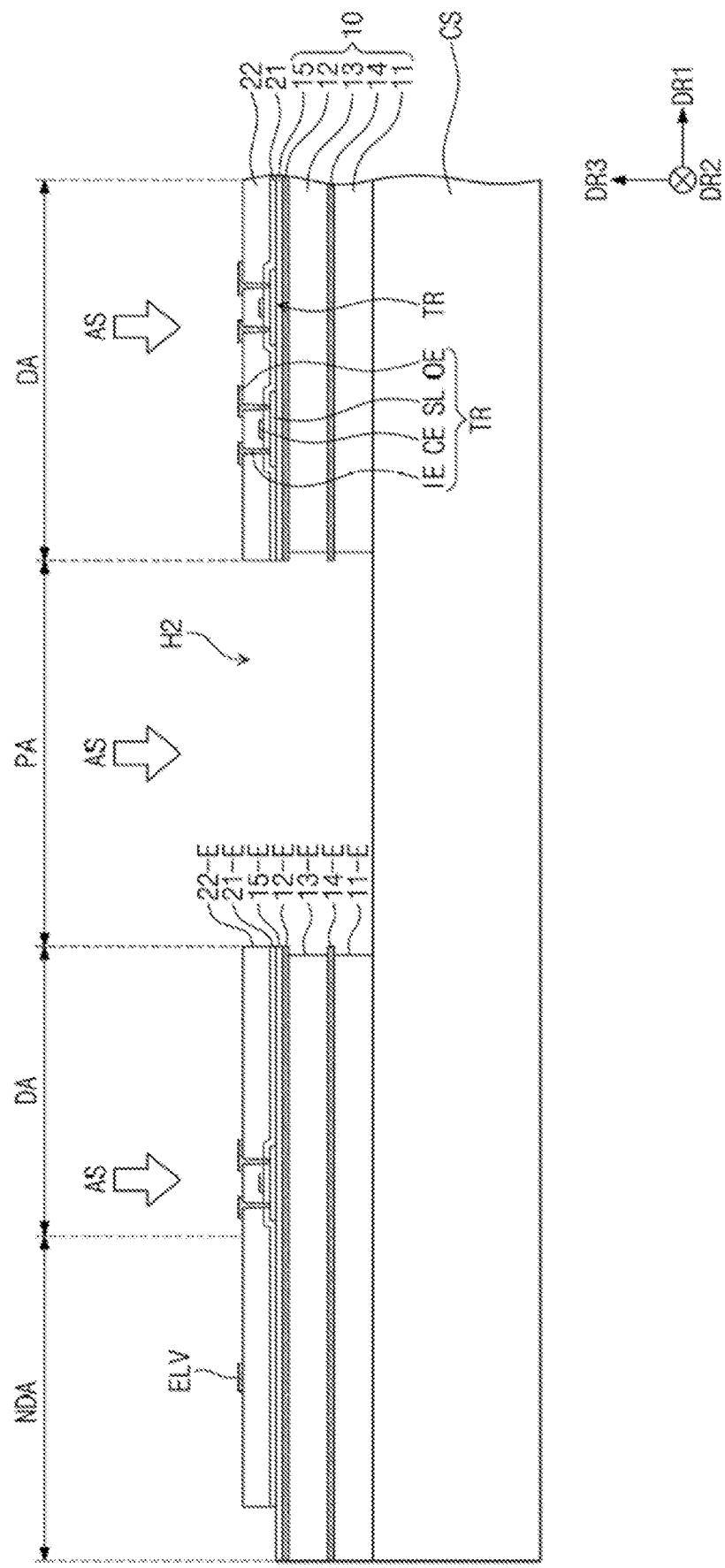

Referring to FIG. 9H, according to an embodiment, an ashing gas AS is provided to remove the photoresist patterns PR. The ashing gas AS includes oxygen plasma. The ashing gas AS reacts with the photoresist patterns PR to reduce the bonding strength between the photoresist patterns PR and the conductive patterns ELV, IE and OE and removes the photoresist patterns PR.

However, according to an embodiment, the ashing gas AS also reacts with the first and second base layers 11 and 13 exposed by the first hole H1. The first and second base layers 11 and 13 are partially removed by the asking gas AS. The first and second base layers 11 and 13 include an organic material, which is similar to that of the photoresist patterns PR. Thus, the first and second base layers 11 and 13 have a high reactivity with the ashing gas AS.

On the other hand, according to an embodiment, the ashing gas AS does not react with the first and second barrier layers 12 and 14, which are formed of an inorganic material. Thus, the first base layer 11 has a shape undercut from the second barrier layer 14, and the second base layer 13 has a shape undercut from the first barrier layer 12.

According to an embodiment, after providing the ashing gas AS, an end 11-E of the first base layer and an end 13-E of the second base layer are no longer aligned with an end 12-E of the first barrier layer and an end 14-E of the second barrier layer. Thus, a second hole H2 is formed whose inner surfaces have one or more undercut shapes. The second hole H2 is bounded by the end 11-E of the first base layer, the end 12-E of the first barrier layer, the end 13-E of the second base layer, the end 14-E of the second barrier layer, an end 15-E of the buffer layer, an end 21-E of the first insulating layer, and an end 22-E of the second insulating layer.

Figure 9I:
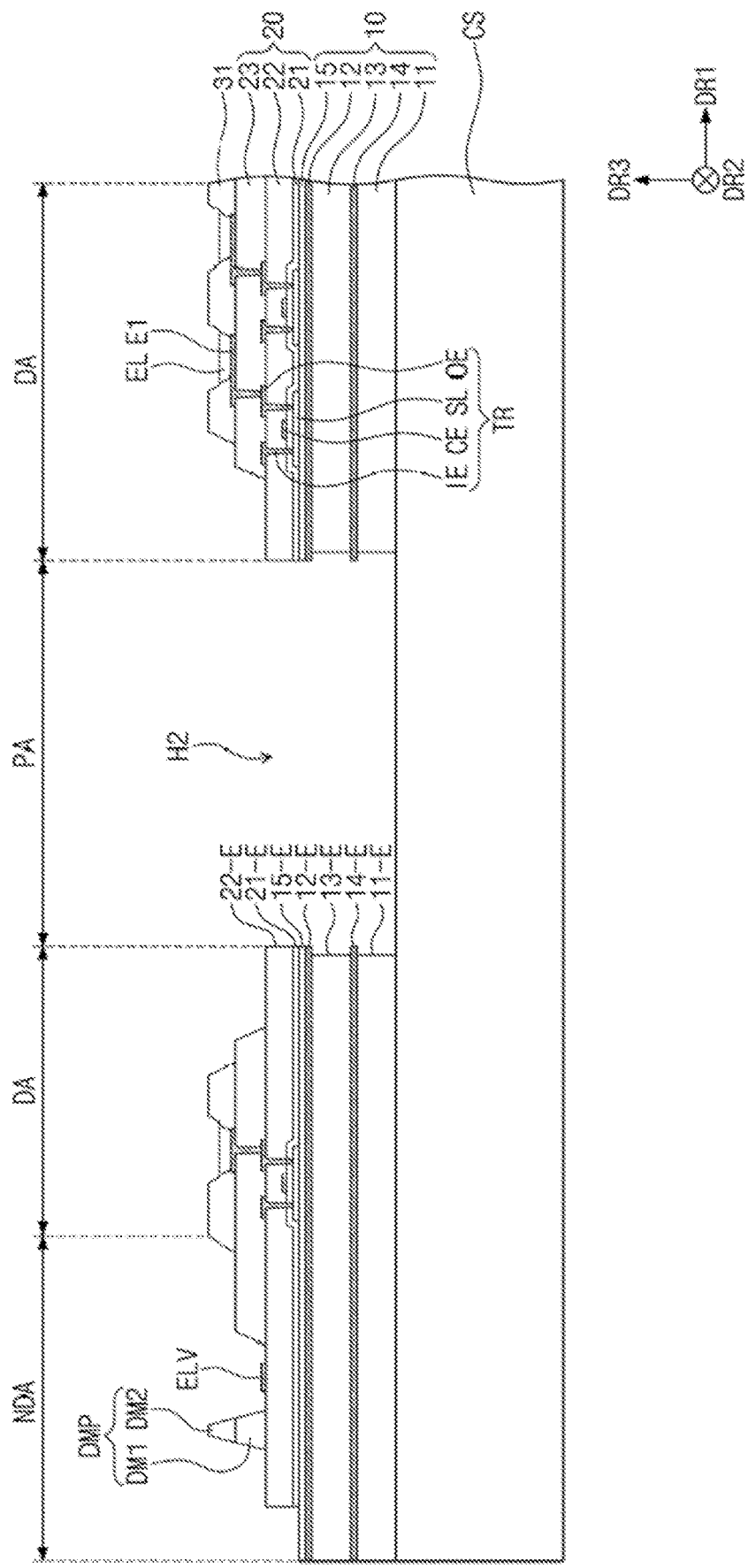

Referring to FIG. 9I, according to an embodiment, a third insulating layer 23, a first electrode E1, a fourth insulating layer 31 and an emission layer EL are sequentially formed on the insulating substrate 10. The third insulating layer 23 is formed on the second insulating layer 22 to cover the thin film transistor TR that includes the electrodes CE, IE and OE and the semiconductor pattern SL. The third insulating layer 23 is patterned to be spaced apart from the auxiliary electrode pattern ELV and the hole area PA. However, embodiments of the inventive concepts are not limited thereto. In another embodiment, the third insulating layer 23 extends into the hole area PA and includes an end that bounds the second hole H2.

According to an embodiment, the first electrode E1 is formed on the third insulating layer 23. In detail, a conductive material is formed, and then the conductive material is patterned to form the first electrode E1. The first electrode E1 penetrates the third insulating layer 23 to be connected to the output electrode OE. A plurality of first electrodes E1 are provided, and the first electrodes E1 correspond to the thin film transistors TR.

According to an embodiment, fourth insulating layer 31 is formed on the third insulating layer 23 and covers the first electrode E1. In detail, an insulating material is deposited and then patterned to form the fourth insulating layer 31. A plurality of openings are formed in the fourth insulating layer 31. The openings expose the first electrodes E1.

According to an embodiment, the emission layer EL is formed in each of the openings of the fourth insulating layer 31. The emission layer EL is formed using a process, such as an inkjet process, of a deposition process.

In addition, according to an embodiment, a dam portion DMP is simultaneously formed with the third and fourth insulating layers 23 and 31. For example, a first dam portion DMP1 of the dam portion DMP is formed when the third insulating layer 23 is formed, and a second dam portion DMP2 of the dam portion DMP is formed when the openings are formed in the fourth insulating layer 31. Thus, the dam portion DMP can be formed without an additional process.

Figure 9J:
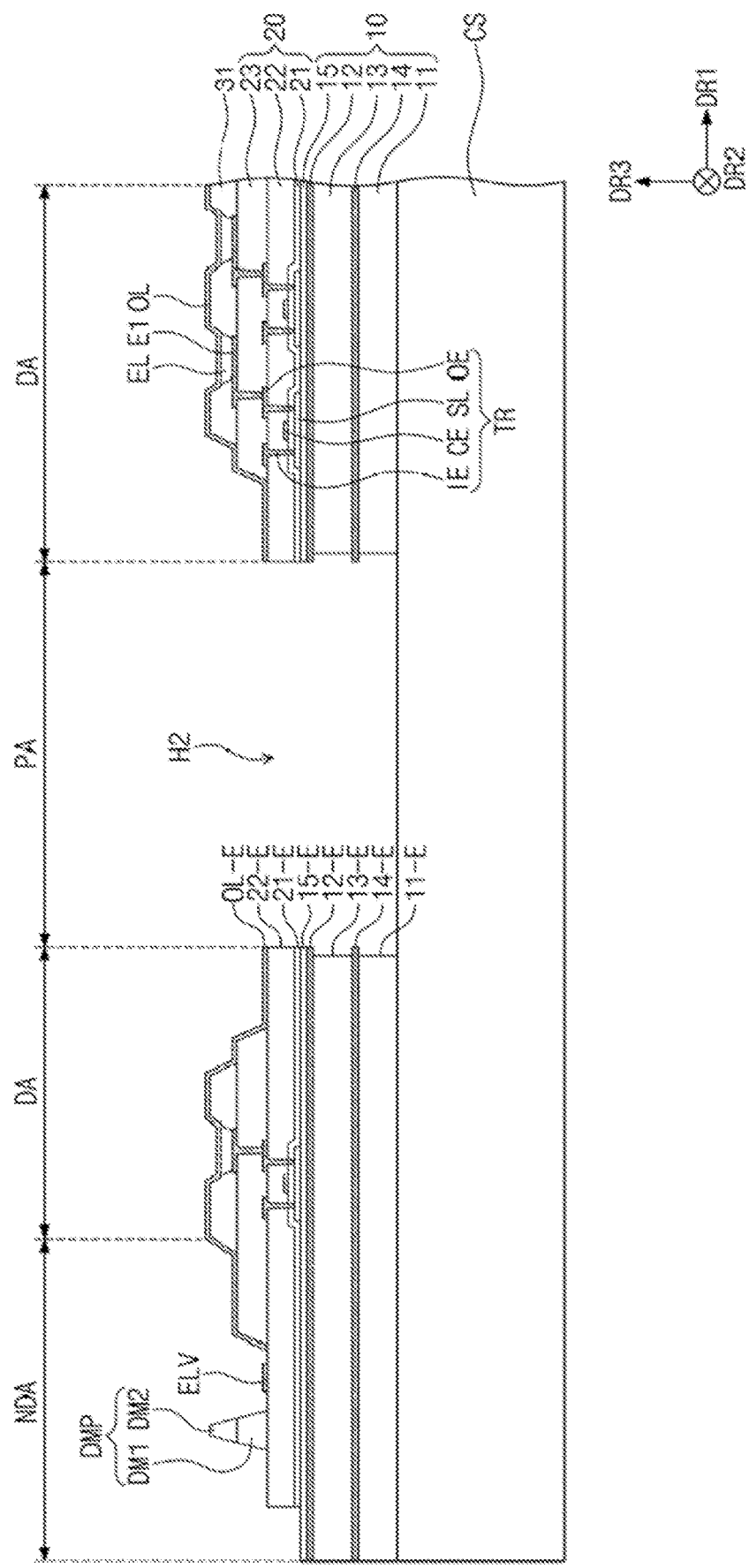

Referring to FIG. 9J, according to an embodiment, charge control layer OL is formed on the fourth insulating layer 31. The charge control layer OL over the whole display area DA and in at least a portion of the peripheral area NDA.

According to an embodiment, the charge control layer OL is formed by depositing an organic material through an open mask. The charge control layer OL is formed by an evaporation process in which the organic material is provided in the third direction DR3. Thus, the charge control layer OL is not formed on the inner surface of the second hole H2 but rather on a top surface of the second insulating layer 22, a top surface of the third insulating layer 23, and a top surface of the fourth insulating layer 31.

Figure 9K:
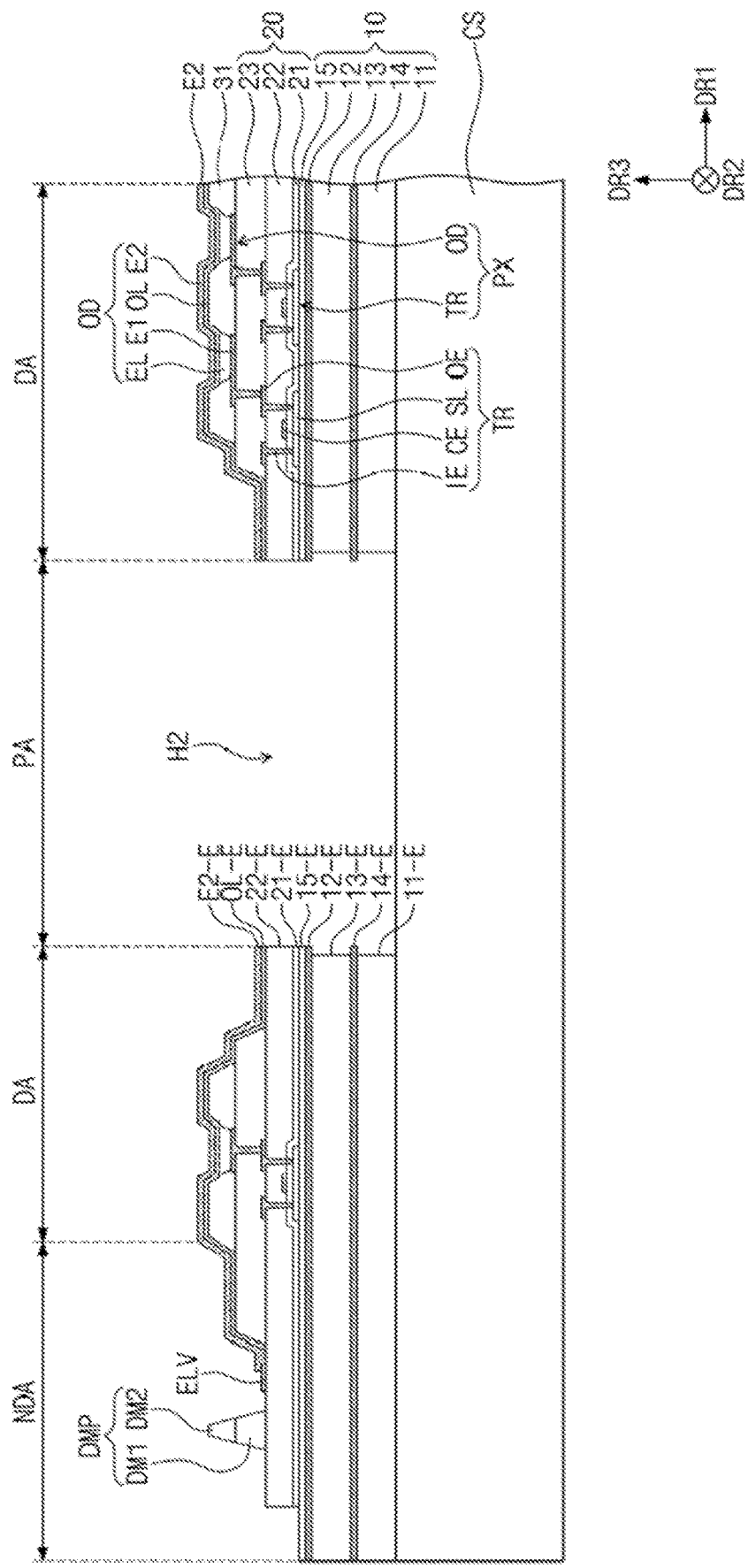

Referring to FIG. 9K, according to an embodiment, a second electrode E2 is formed on the charge control layer OL. Forming the second electrode E2 completes the formation of an organic light emitting device OD and a pixel PX.

According to an embodiment, the second electrode E2 is formed over the whole display area DA through an open mask. In addition, the second electrode E2 is also formed in at least a portion of the peripheral area NDA. In a present embodiment, the second electrode E2 extends into the peripheral area NDA to be connected to the auxiliary electrode pattern ELV. The second electrode E2 is also deposited in the third direction DR3 and thus does not form on the inner surface of the second hole H2.

Figure 9L:
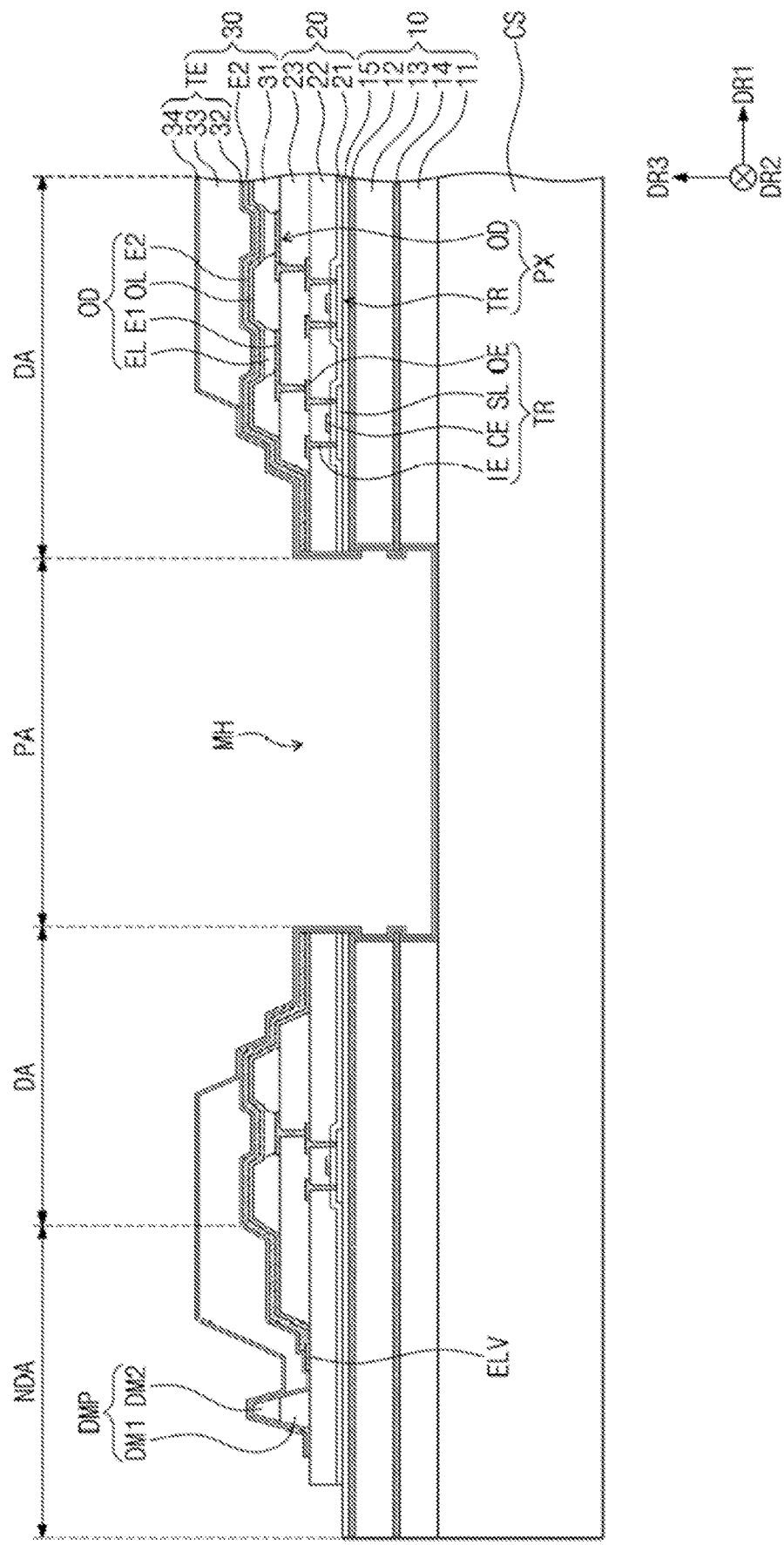

Referring to FIG. 9L, according to an embodiment, an encapsulation member TE is formed on the second electrode E2. The encapsulation member TE substantially covers an area on which the second electrode E2 is formed, and thus the encapsulation member TE can encapsulate the organic light emitting device OD.

According to an embodiment, a first inorganic film 32 of the encapsulation member TE is formed on an entire surface of the insulating substrate 10 by a chemical vapor deposition (CVD) process. At this time, the first inorganic film 32 is isotropically deposited to cover the inner surface of the second hole H2. The first inorganic film 32 is formed on the ends and the undercut portions, which bound the second hole H2.

According to an embodiment, an organic film 33 of the encapsulation member TE is formed by an inkjet process. A viscous liquid organic material is provided to an area of the display area DA spaced apart from the hole area PA and flows onto and coats at least a portion of the first inorganic film 32.

According to an embodiment, a second inorganic film 34 of the encapsulation member TE is formed by a deposition process. Thus, the second inorganic film 34 is formed on the entire portion of the organic film 33 and the first inorganic film 32. The second inorganic film 34 is formed similarly to the first inorganic film 32. Thus, the second inorganic film 34 covers inner surfaces of the undercut portions in the hole area PA. The second hole H2 covered by the first and second inorganic films 32 and 34 is a module hole MH.

Figure 9M:
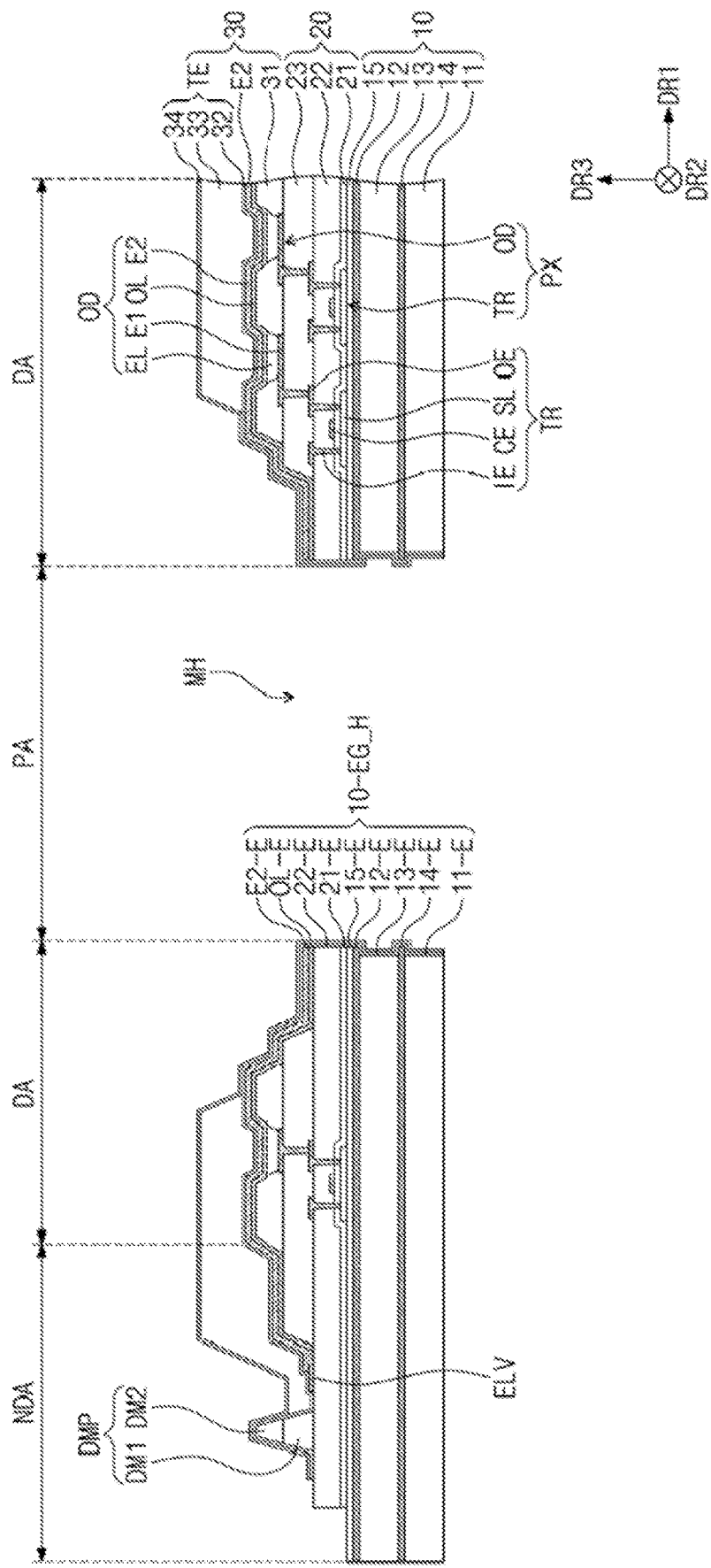

Referring to FIG. 9M, according to an embodiment, the carrier substrate CS is removed to manufacture a display panel. Thus, the first and second inorganic films 32 and 34 that remain on the carrier substrate CS exposed in the hole area PA are removed to form the module hole MH in the hole area PA.

According to embodiments of the inventive concepts, the module hole MH is formed through a plurality of etching processes and an ashing process. Thus, the module hole MH can be formed without an additional process. As a result, a manufacturing process is simplified and a process cost is reduced. In addition, since the module hole MH is formed using a difference of etching rates, fine features of the module hole MH can be easily formed.

In addition, according to an embodiment, the blocking recess BR of FIG. 5B can be formed by a method similar to the method of forming the module hole MH. However, the inventive concepts are not limited to a specific embodiment.

According to embodiments of the inventive concepts, a display panel is provided that does not interfere with an electronic module. Thus, even though the display apparatus includes an electronic module, a display apparatus can be provided which has a wide display area without an increased bezel area. In addition, components can be protected from damage from external moisture or oxygen. Thus, the reliability of a manufacturing process and the display apparatus itself can be improved.

Furthermore, according to embodiments of the inventive concepts, a module hole with reduced defects can be easily formed without an additional process. Thus, the manufacturing processes can be simplified and the process cost can be reduced.

While embodiments of the inventive concepts have been described with reference to exemplary embodiments, it will be apparent to those skilled in the art that various changes and modifications may be made without departing from the spirits and scopes of exemplary embodiment of the inventive concepts. Therefore it should be understood that exemplary embodiments are not limiting, but illustrative. Thus, the scopes of embodiments of the inventive concepts are to be determined by the broadest permissible interpretation of the following claims and their equivalents, and shall not be restricted or limited by the foregoing description.

What is claimed is:

1. A display apparatus, comprising:
    a display panel that includes a front surface that includes a hole area, a display area that surrounds the hole area, and a peripheral area adjacent to the display area; and a rear surface opposite to the front surface; and
    an electronic module that overlaps the display panel,
    wherein the display panel comprises:
        an insulating substrate that includes a base layer and a barrier layer;
        an organic light emitting device disposed on the insulating substrate of the display area and that includes an emission layer and an organic layer;
        an encapsulation member that covers the organic light emitting device and includes an inorganic film and an organic film; and
        a module hole spaced apart from the peripheral area and formed in the hole area that penetrates the insulating substrate and the organic layer,
    wherein the electronic module overlaps the module hole,
    wherein the base layer and the barrier layer include ends at the module hole; and
    wherein the end of the base layer and the end of the barrier layer are covered by the inorganic film.

2. The display apparatus of claim 1, wherein the end of the base layer and the end of the barrier layer are not aligned with each other in the thickness direction.

3. The display apparatus of claim 2, wherein an end of the organic layer is aligned with the end of the barrier layer, and
    wherein the inorganic film covers the end of the organic layer.

4. The display apparatus of claim 1, wherein the electronic module receives an external input provided to the front surface of the display panel through the module hole.

5. The display apparatus of claim 2, wherein the electronic module is received in the module hole.

6. The display apparatus of claim 1, wherein the display panel further comprises: a blocking recess formed in the hole area, wherein the blocking recess is spaced apart from the module hole and surrounds the module hole,
    wherein a depth of the blocking recess is less than a depth of the module hole.

7. The display apparatus of claim 6, wherein the blocking recess includes: a hole portion that penetrates the barrier layer; and a recessed portion formed in the base layer.

8. The display apparatus of claim 1, wherein the base layer includes an organic material and the harrier layer includes an inorganic material.

* * * * *

UNITED STATES PATENT AND TRADEMARK OFFICE
CERTIFICATE OF CORRECTION

PATENT NO. : 11,574,973 B2  
APPLICATION NO. : 17/094247  
DATED : February 7, 2023  
INVENTOR(S) : Yu-Gwang Jeong et al.

Page 1 of 1

It is certified that error appears in the above-identified patent and that said Letters Patent is hereby corrected as shown below:

In the Claims

Column 21, Line 15 In Claim 1, Line 1: replace "display" with "electronic".

Column 22, Line 7 In Claim 2, Line 1: replace "display" with "electronic".

Column 22, Line 10 In Claim 3, Line 1: replace "display" with "electronic".

Column 22, Line 14 In Claim 4, Line 1: replace "display" with "electronic".

Column 22, Line 18 In Claim 5, Line 1: replace "display" with "electronic".

Column 22, Line 20 In Claim 6, Line 1: replace "display apparatus" with "electronic apparatus".

Column 22, Line 26 In Claim 7, Line 1: replace "display" with "electronic".

Column 22, Line 29 In Claim 8, Line 1: replace "display" with "electronic".

Signed and Sealed this  
Eighth Day of October, 2024

Katherine Kelly Vidal  
*Director of the United States Patent and Trademark Office*